(12) United States Patent
Kohiro et al.

(10) Patent No.: US 9,178,165 B2
(45) Date of Patent: Nov. 3, 2015

(54) ORGANIC SEMICONDUCTOR COMPOSITION, ORGANIC THIN FILM, AND ORGANIC THIN FILM TRANSISTOR HAVING SAME

(75) Inventors: Kenji Kohiro, Tsukuba (JP); Takayuki Okachi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 100 days.

(21) Appl. No.: 13/809,705

(22) PCT Filed: Jul. 13, 2011

(86) PCT No.: PCT/JP2011/065958
§ 371 (c)(1),
(2), (4) Date: Feb. 25, 2013

(87) PCT Pub. No.: WO2012/008483
PCT Pub. Date: Jan. 19, 2012

(65) Prior Publication Data
US 2013/0140548 A1    Jun. 6, 2013

(30) Foreign Application Priority Data
Jul. 13, 2010    (JP) .................................. 2010-158896

(51) Int. Cl.
*H01L 51/00*    (2006.01)
*H01L 51/05*    (2006.01)

(52) U.S. Cl.
CPC ........ *H01L 51/0071* (2013.01); *H01L 51/0074* (2013.01); *H01L 51/0036* (2013.01); *H01L 51/0039* (2013.01); *H01L 51/0558* (2013.01)

(58) Field of Classification Search
CPC .................. H01L 51/0071; H01L 51/0074
USPC ............................................ 252/500; 257/40
See application file for complete search history.

(56) References Cited

U.S. PATENT DOCUMENTS

| | | | |
|---|---|---|---|
| 6,541,300 B1 | 4/2003 | Chowdhuri et al. | |
| 2004/0038459 A1 | 2/2004 | Brown et al. | |
| 2006/0155040 A1 | 7/2006 | Veres et al. | |
| 2007/0117973 A1* | 5/2007 | Yamaguchi et al. | 540/1 |
| 2007/0158646 A1 | 7/2007 | Reichmanis et al. | |
| 2009/0001357 A1* | 1/2009 | Takimiya et al. | 257/40 |
| 2011/0108813 A1* | 5/2011 | Kohiro et al. | 257/40 |

FOREIGN PATENT DOCUMENTS

| | | | |
|---|---|---|---|
| JP | 2004-006754 A | 1/2004 | |
| JP | 2004-158710 A | 6/2004 | |
| JP | 2008-010541 A | 1/2008 | |
| JP | 2009-267372 A | 11/2009 | |
| JP | 2009-283786 A | 12/2009 | |
| TW | 200604203 A | 2/2006 | |
| TW | 201001773 A | 1/2010 | |
| WO | 2005/087780 A1 | 9/2005 | |
| WO | WO 2009122956 A1 * | 10/2009 | |

OTHER PUBLICATIONS

Translation of the International Preliminary Report on Patentability and Written Opinion mailed Feb. 21, 2013 in International Application No. PCT/JP2011/065958 to Sumitomo Chemical Co., Ltd.
Toshihiro Okamoto, et al., "General Synthesis of Thiophene and Selenophene-Based Heteroacenes", Organic letters, Oct. 21, 2005, vol. 7, No. 23, pp. 5301-5304.
Communication from Taiwan Patent Office issued Dec. 9, 2014 in counterpart Taiwan Patent Application No. 100124732.
Communication dated Jun. 30, 2015 from the Taiwanese Intellectual Property Office in counterpart application No. 100124732.

* cited by examiner

*Primary Examiner* — Douglas Mc Ginty
(74) *Attorney, Agent, or Firm* — Sughrue Mion, PLLC

(57) ABSTRACT

To provide an organic semiconductor composition that can exhibit a high carrier transport property and give uniform characteristics. An organic semiconductor composition characterized by containing a high molecular weight compound having a carrier transport property and a low molecular weight compound, in which the low molecular weight compound has a structure represented by Formula (1) and a content ratio of the low molecular weight compound is from 5 to 95 parts by mass relative to a total of 100 parts by mass of the high molecular weight compound and the low molecular weight compound,

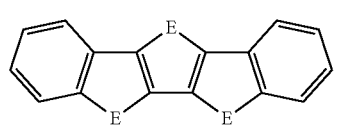

(1)

[where, E represents a sulfur atom or a selenium atom, three E's may be the same or may be different from one another, and an aromatic ring in Formula may have substituents].

6 Claims, 13 Drawing Sheets

ORGANIC SEMICONDUCTOR COMPOSITION, ORGANIC THIN FILM, AND ORGANIC THIN FILM TRANSISTOR HAVING SAME

CROSS REFERENCE TO RELATED APPLICATIONS

This application is a National Stage of International Application No. PCT/JP2011/065958 filed Jul. 13, 2011, claiming priority based on Japanese Patent Application No. 2010-158896 filed Jul. 13, 2010, the contents of all of which are incorporated herein by reference in their entirety.

TECHNICAL FIELD

The present invention relates to an organic semiconductor composition, an organic thin film, and an organic thin film transistor having the same.

BACKGROUND ART

As a semiconductor device having a semiconductor thin film, an organic thin film device having an organic thin film composed of an organic semiconductor material attracts attention. In the manufacture of organic thin film devices, since an organic thin film may be formed easily by coating an organic semiconductor material, there is such an advantage that large area devices can be produced at a low cost.

Characteristics of an organic thin film device depend largely on a carrier transport property of the organic thin film. A higher carrier transport property enables the organic thin film device to exhibit excellent characteristics as an organic thin film device. For example, in the case of an organic field-effect transistor having a carrier transport layer composed of an organic thin film, a higher carrier transport property of the organic thin film enables more current to flow, and the adjustable amount of current can be broadened. As the result, excellent characteristics can be obtained as a transistor.

From this viewpoint, recently, organic semiconductor materials having high carrier transport properties are extensively examined. Examples of coatable organic semiconductor materials having high carrier transport properties include pentacene derivatives, polyalkylthiophene etc. However, a field-effect mobility (mobility) that is an indicator of carrier transport property of these organic semiconductor materials has not reached the level of mobility that is usually obtained for conventional amorphous silicon.

Accordingly, Patent Literature 1 proposes a chalcogen-containing polycyclic condensed-ring compound. It is shown that the compound is an organic semiconductor material that is soluble in various solvents and has a high field-effect mobility.

CITATION LIST

Patent Literature

[Patent Literature 1] WO 2005/087780 A

SUMMARY OF INVENTION

Technical Problem

However, in the case where many organic thin film transistors are applied to large area device (for example, an organic EL backplane), if characteristics vary among each device, there may occur such a disadvantage that emission unevenness is generated not to allow the device to be used as a backplane even when characteristics of individual transistors are high. Consequently, for organic thin films, it is also required that uniform characteristics are to be obtained when a plurality of device is formed within the same substrate, in addition to a high field-effect mobility (high carrier transport property).

Therefore, the present invention was achieved in view of such circumstances, and aims at providing an organic semiconductor composition capable of exhibiting a high carrier transport property and giving uniform characteristics. Further, the present invention aims at providing an organic thin film composed of such organic semiconductor composition, and providing an organic thin film transistor having the organic thin film.

Solution to Problem

In order to achieve the above-mentioned purposes, the organic semiconductor composition of the present invention is an organic semiconductor composition, including a high molecular weight compound having a carrier transport property and a low molecular weight compound, wherein: the low molecular weight compound is a compound having a structure represented by Formula (1); and a content ratio of the low molecular weight compound is from 5 to 95 parts by mass relative to a total of 100 parts by mass of the high molecular weight compound and the low molecular weight compound,

[Compound 1]

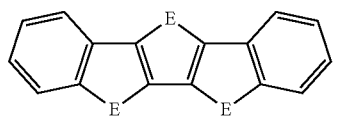

(1)

[where, E represents a sulfur atom or a selenium atom, three E's may be the same or may be different from one another, and an aromatic ring in Formula may have substituents].

In the organic semiconductor composition of the present invention, by using not independently the low molecular weight compound having the structure represented by Formula (1), which is a chalcogen-containing polycyclic condensed-ring compound, but by using it in combination with the high molecular weight compound having a carrier transport property at a prescribed ratio, a high carrier transport property derived from the low molecular weight compound is obtained and, in addition, the low molecular weight compound is brought into homogeneous dispersion by the high molecular weight compound. As the result, the formation of an organic thin film having uniform characteristics becomes possible.

In above-mentioned organic semiconductor composition of the present invention, the high molecular weight compound preferably has a repeating unit containing at least one structure of an arylamine structure, a fluorene structure and a thiophene structure. The use of such a high molecular weight compound in combination with a low molecular weight compound represented by Formula (1) makes it possible to form an organic thin film having furthermore uniform characteristics.

Moreover, in the organic semiconductor composition, the content ratio of the high molecular weight compound is preferably either from not less than 5 parts by mass to less than 30 parts by mass or from more than 70 parts by mass to not more than 95 parts by mass relative to a total of 100 parts by mass of the high molecular weight compound and the low molecular weight compound, and, in particular, the satisfaction of the former condition is more preferable. The content of the high molecular weight compound and the low molecular weight compound in combination so as to satisfy the ratio gives an excellent carrier transport property, and makes it possible to obtain an organic thin film having furthermore excellent uniformity.

The present invention also provides an organic thin film constituted from the above-mentioned organic semiconductor composition of the present invention. Since such organic thin film is composed of the organic semiconductor composition of the present invention, the film can exhibit a high carrier transport property and gives very small variation of characteristics when it is made to have a large area or formed in plural.

Furthermore, the present invention provides an organic thin film transistor having such organic thin film of the present invention. That is, the organic thin film transistor of the present invention is an organic thin film transistor, including a source electrode and a drain electrode, an organic semiconductor layer that serves as a current path between these electrodes, and a gate electrode that controls an amount of current flowing through the current path, wherein the organic semiconductor layer includes the organic thin film of the above-mentioned present invention. The organic thin film transistor having such configuration has the organic thin film of the present invention, and, therefore, the transistor can exhibit excellent transistor characteristics, and give uniform and stable characteristics even when the organic thin film of a large area is applied, and a small variation of characteristics among devices is given even when many transistors are formed.

Advantageous Effects of Invention

According to the present invention, it becomes possible to provide an organic semiconductor composition capable of exhibiting a high carrier transport property and of giving uniform characteristics. Further, according to the present invention, it becomes possible to provide an organic thin film that is composed of such organic semiconductor composition and has a high carrier transport property and uniform characteristics, and to provide an organic thin film transistor that has the organic thin film and has high transistor characteristics.

DESCRIPTION OF EMBODIMENTS

Figure 1:
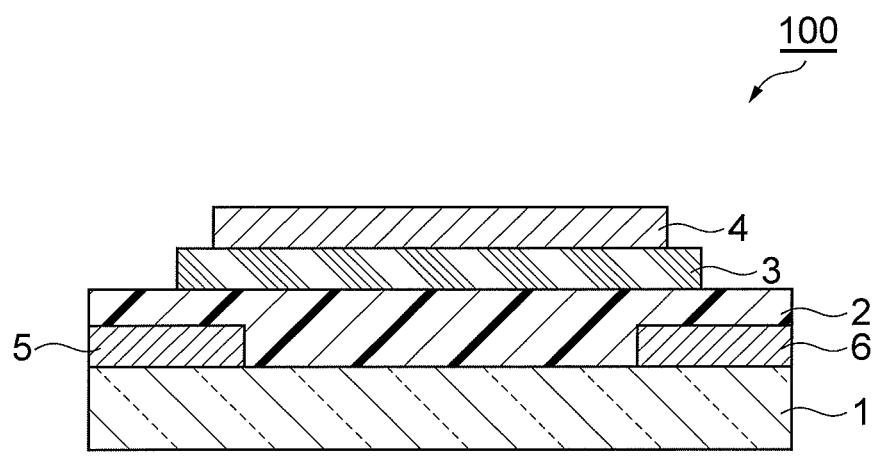
FIG. 1 is a schematic cross-sectional view of an organic thin film transistor according to a first embodiment.

Hereinafter, with reference to the drawings according to need, preferable embodiments of the present invention will be described. Note that, in the description of the drawings, the same reference numeral will be given to the same component, and repeated descriptions are omitted.

[Organic Semiconductor Composition]

The organic semiconductor composition of the present embodiment contains a high molecular weight compound having a carrier transport property and a low molecular weight compound, and the low molecular weight compound has a structure represented by Formula (1).

[Compound 2]

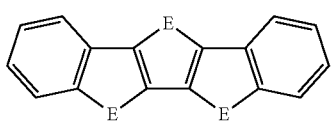

(1)

[where, E represents a sulfur atom or a selenium atom, three E's may be the same or may be different from one another, and an aromatic ring in Formula may have a substituent].

First, the low molecular weight compound will be described. As the low molecular weight compound having the structure represented by Formula (1), compounds represented by following Formulae (1a) to (1t) are preferable.

[Compound 3]

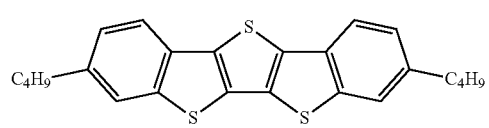

(1a)

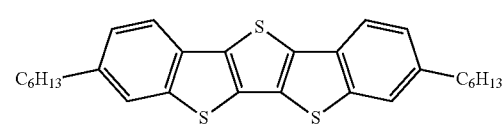

(1b)

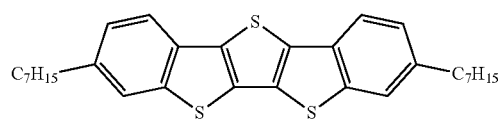 (1c)
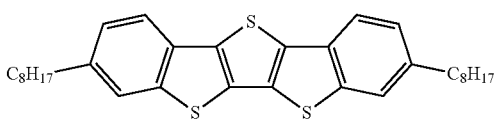 (1d)
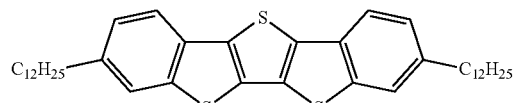 
[Compound 4]
(1e)
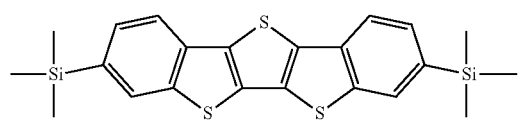 (1f)
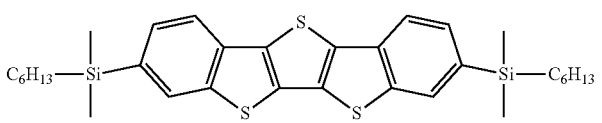 (1g)
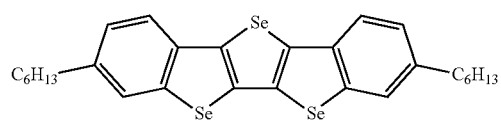 (1h)
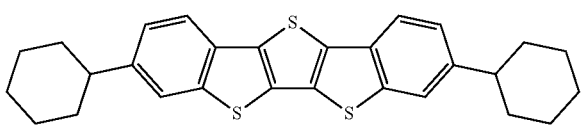 (1i)
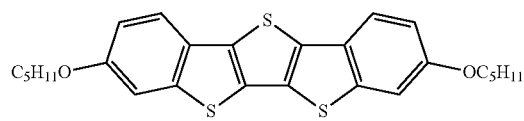 (1j)
[Compound 5]
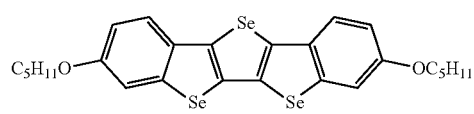 (1k)
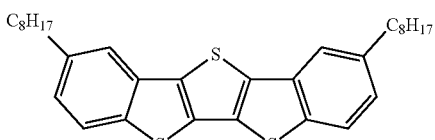 (1l)
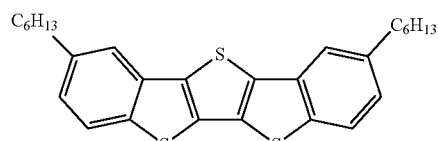 (1m)
(1n)
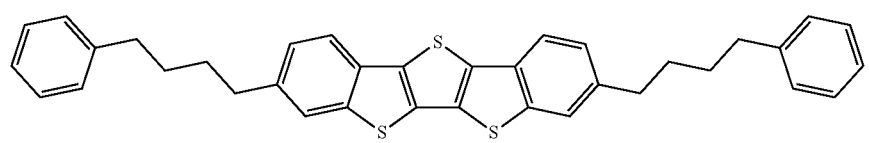 (1o)
[Compound 6]
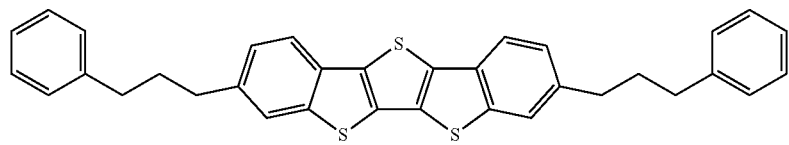 (1p)
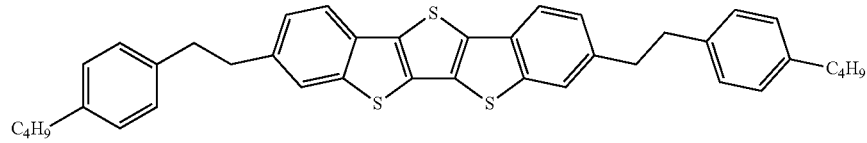 (1q)

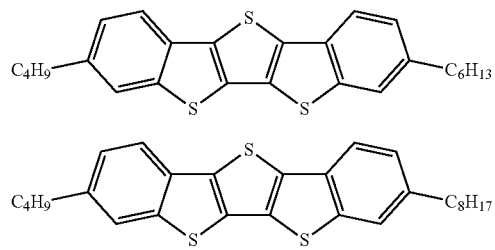

(1r)

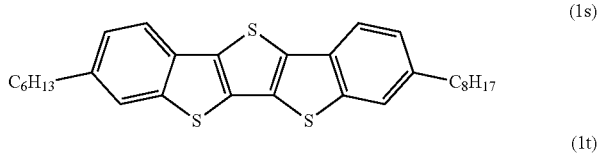

(1s)

(1t)

Next, the high molecular weight compound having a carrier transport property will be described. Here, the carrier transport property is characteristics that enable, when a structure such as a film is formed, carriers such as electrons and holes to move in the structure, and, generally, carrier mobility is used as an index thereof. The carrier mobility is shown here by field-effect mobility. Although the value thereof alone can not define unambiguously the presence or absence of the carrier transport property, in the present invention, in the case where the structure is a thin film and a field-effect mobility of not less than $1 \times 10^{-6}$ cm$^2$/Vs can be obtained, a material thereof is assumed to have a carrier transport property. The value of the field-effect mobility may be a value when the thickness of the thin film is 30 nm.

The high molecular weight compound has the weight average molecular weight in terms of polystyrene of preferably not less than 8,000, more preferably from 10,000 to 1,000,000, furthermore preferably from 30,000 to 500,000. Moreover, the number average molecular weight thereof in terms of polystyrene is preferably from 18,000 to 500,000, and more preferably from 20,000 to 450,000.

As the high molecular weight compound having carrier transport property, high molecular weight compounds having a conjugated unsaturated structure are preferable. The high molecular weight compounds having a conjugated unsaturated structure are, for example, homopolymers and copolymers having at least one kind of structural unit as a repeating unit in plural, the structural unit containing a structure selected from structures containing a double bond, structures containing a triple bond, aromatic structures and arylamine structures (tertiary arylamine structures) singly or in combination of a plurality of kinds as an unsaturated structure and having the conjugation due to the unsaturated structure in an extended state as a whole. In the case of the copolymer, it may be either of a random body and a block body. The conjugation due to the unsaturated structure in an extended state as a whole is preferably perfect conjugation.

Here, examples of the structure containing a double bond include an ethylene structure. The "ethylene structure" means a structure that is brought into ethylene when a bonding hand offered for a bonding with another structural unit is substituted with a hydrogen atom. Incidentally, in the present description, every representation in which "structure" is added subsequent to a name representing a compound follows the same definition.

Moreover, the structure containing a triple bond is an acetylene structure. Furthermore, as the aromatic structure, a mononuclear or polynuclear aromatic hydrocarbon structure, or a mononuclear or polynuclear heterocyclic structure is mentioned. Examples of the mononuclear or polynuclear aromatic hydrocarbon structures include a phenylene structure (that is, a benzene structure), a naphthylene structure (that is, a naphthalene structure), a fluorene structure, an acenaphthene structure, a phenanthrene structure, an anthracene structure, a fluoranthene structure, a pyrene structure, a perylene structure, a rubrene structure, a chrysene structure, and a polynuclear condensed-ring compound structure formed by condensation of rings constituting these structures.

Specific examples of the mononuclear or polynuclear aromatic hydrocarbon structures include structures represented by Formulae (2a) to (2f). Among these, those having such a fluorene structure as represented by Formula (2a) or (2b) are particularly preferable. Incidentally, in the following Formulae, a bonding to which a substituent is not attached means a bonding hand forming a bonding with another structural unit.

[Compound 7]

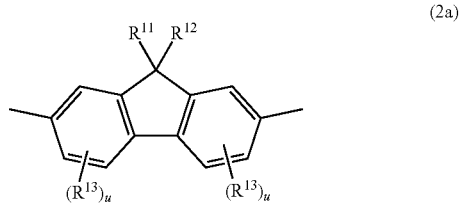

(2a)

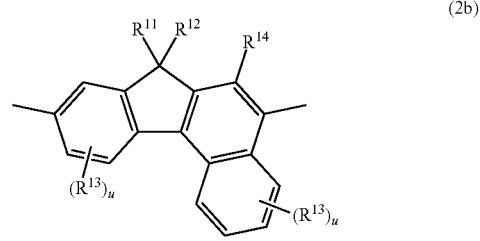

(2b)

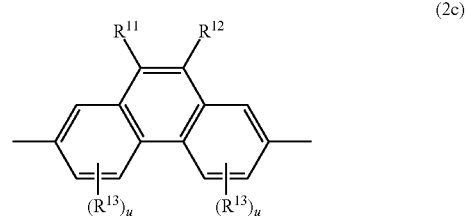

(2c)

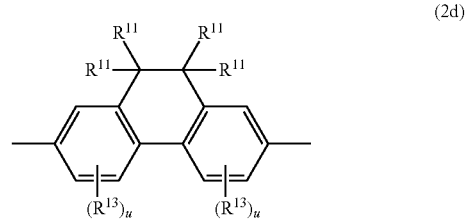

(2d)

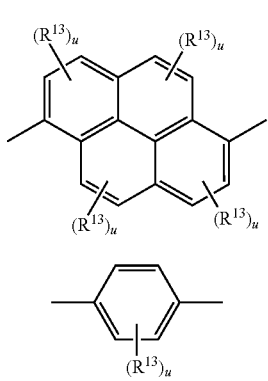

(2e)

(2f)

In Formulae (2a) to (2f), each of $R^{11}$, $R^{12}$ and $R^{14}$ is independently a hydrogen atom, a halogen atom or a monovalent group, and $R^{13}$ is a halogen atom or a monovalent group. Additionally, u is an integer of zero or more. Examples of the monovalent groups include a saturated hydrocarbon group, an unsaturated hydrocarbon group, an aryl group, a heteroaryl group, an alkoxy group, an amino group, a carbonyl group, a nitro group, a hydroxyl group, a cyano group, an arylalkyl group, a heteroarylalkyl group, an aryloxy group, a heteroaryloxy group, an alkylsilyl group etc. These monovalent groups may be furthermore substituted with a substituent, and examples of the substituent include the group represented by $R^{13}$.

Above-mentioned saturated hydrocarbon groups have usually 1 to 20 carbons, preferably 1 to 16 carbons. The saturated hydrocarbon group may be in a linear chain or in a branched chain. Examples of the saturated hydrocarbon group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group and an n-eicosanyl group.

Above-mentioned unsaturated hydrocarbon groups have usually 1 to 20 carbons, preferably 1 to 16 carbons. The unsaturated hydrocarbon groups may be in a linear chain or may be in a branched chain. Examples of the unsaturated hydrocarbon groups include a vinyl group, a 1-propenyl group, an aryl group, a propargyl group, an isopropenyl group, a 1-butenyl group and a 2-butenyl group. Among these, from the viewpoint of chemical stability, a group having one double bond or one triple bond in the unsaturated hydrocarbon group is preferable.

Above-mentioned alkoxy groups have usually 1 to 20 carbons, preferably 1 to 16 carbons. The alkoxy groups may be in a linear chain or may be in a branched chain. Examples of the alkoxy groups include a methyloxy group, an ethyloxy group, an n-propyloxy group, an isopropyloxy group, an n-butyloxy group, an isobutyloxy group, a sec-butyloxy group, a tert-butyloxy group, an n-pentyloxy group, an n-hexyloxy group, an n-heptyloxy group, an n-octyloxy group, an n-nonyloxy group, an n-decyloxy group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group and an n-eicosanyloxy group.

Above-mentioned aryl groups have usually 6 to 60 carbons, preferably 6 to 20 carbons. Examples of the aromatic hydrocarbon groups include a phenyl group, a fluorenyl group, a naphthyl group and an anthracenyl group.

Above-mentioned heteroaryl groups have usually 4 to 60 carbons, preferably 4 to 20 carbons. Here, the heteroaryl group is a group of atoms left after removing one hydrogen atom from an aromatic heterocyclic compound. The aromatic heterocyclic compound is a heterocyclic compound with a ring having aromatic properties. Examples of the hetero atoms contained in a heterocyclic compound include an oxygen atom, a sulfur atom, a nitrogen atom, a phosphorous atom, a boron atom and a silicon atom. Examples of the heterocyclic compounds include thiophene, selenophene and furan.

In above-mentioned arylalkyl groups or aryloxy groups, an "aryl" part has usually 6 to 60 carbons, preferably 6 to 20 carbons. Moreover, in the arylalkyl groups, an "alkyl" part has usually 1 to 20 carbons, preferably 1 to 10 carbons.

In above-mentioned heteroarylalkyl groups or the heteroaryloxy groups, a "heteroaryl" part has usually 4 to 60 carbons, preferably 4 to 20 carbons. In the heteroarylalkyl groups, an "alkyl" part has usually 1 to 20 carbons, preferably 1 to 10 carbons.

Examples of the above-mentioned alkylsilyl group include groups in which a part or all of the hydrogen atoms in a silyl group are substituted with the above-mentioned saturated hydrocarbon group.

Examples of the above-mentioned halogen atoms include a fluorine atom, a chlorine atom, a bromine atom and an iodine atom.

When a plurality of $R^{11}$ or $R^{13}$ is contained, the plurality of $R^{11}$ or $R^{13}$ may, respectively, be same or different from each other. Moreover, when two kinds of $R^{11}$, $R^{12}$, $R^{13}$ and $R^{14}$, or two of $R^{11}$s or two of $R^{13}$s are bonded to the same carbon atom or to adjacent carbon atoms, groups in the relation may be bonded in a part each other to form a ring. The ring formed in this case may be either of a monocyclic ring and a condensed ring, and may be a carbon ring or a heterocyclic ring. Further, these rings may have a substituent. Among these, a monocyclic carbon ring, or a monocyclic heterocyclic ring containing an oxygen atom or a sulfur atom as a hetero atom is preferable.

Furthermore, among mononuclear or polynuclear heterocyclic structures, examples of the mononuclear heterocyclic structures include, as 5-membered heterocyclic structures, a furan structure, a thiophene structure, a pyrrole structure, a silole structure, an oxazole structure, an isoxazole structure, a thiazole structure, an isothiazole structure, an imidazole structure, an oxadiazole structure, a thiadiazole structure, a pyrazole structure etc. Further, as 6-membered heterocyclic structures, a pyridine structure, a pyridazine structure, a pyrimidine structure, a pyrazine structure, a triazine structure, a tetrazene structure etc. are mentioned.

On the other hand, examples of the polynuclear heterocyclic structures also include structures of a benzo-condensed ring system, such as a benzoxazole structure, a benzothiazole structure, a benzimidazole structure, a quinoline structure, an isoquinoline structure, a cinnoline structure, a quinazoline structure, a phthalazine structure, a benzothiadiazole structure and a benzotriazine structure. In addition, polynuclear condensed ring system structures, such as a phenazine structure, a phenanthridine structure, an acridine structure, a carbazole structure, a dibenzofuran structure, a dibenzothiophene structure, a dibenzosilole structure, a diphenyleneoxide structure, a thienothiophene structure, a thiazolothiazole structure, a dithienothiophene structure, a benzobisthiophene structure and a benzobisthiazole structure are also mentioned. Furthermore, condensed structures formed by the condensation of a plurality of above-mentioned mononuclear or polynuclear heterocyclic structures are also mentioned.

Examples of such mononuclear or polynuclear heterocyclic structures include structures represented by Formulae (3a) to (3o), and condensed structures formed by the coupling of a plurality of these. Among these, the structure represented by Formula (3a) or condensed structures formed by the coupling of a plurality of the structures, the thiophene structures or condensed thiophene structures (structures in which Z in the following Formulae is a sulfur atom) are particularly preferable. Incidentally, in Formulae below, the bonding to which no substituent is attached means a bonding hand forming bonding with another structural unit.

[Compound 8]

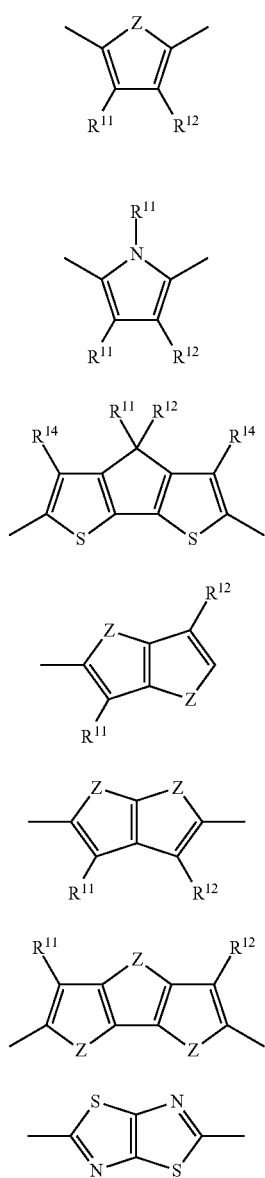

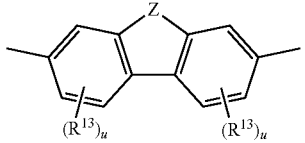

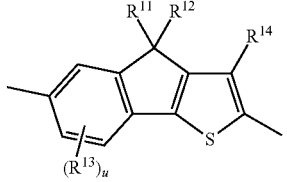

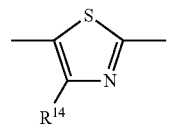

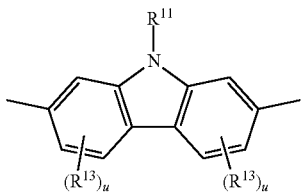

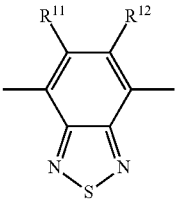

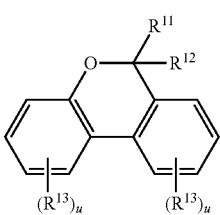

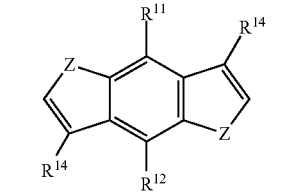

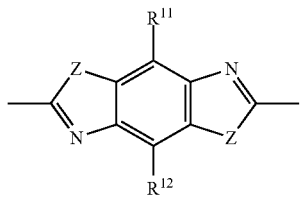

In Formulae (3a) to (3o), $R^{11}$, $R^{12}$, $R^{13}$, $R^{14}$ and u have the same meaning as those in the case of Formulae (2a) to (2f) described above. In addition, Z is a hetero atom such as an oxygen atom, a sulfur atom, a nitrogen atom, a phosphorous atom, a boron atom or a silicon atom. Furthermore, when each of $R^{11}$, $R^{13}$ and $R^{14}$ exists in plural, they may be same or different, respectively.

Furthermore, as the arylamine structure, tertiary arylamine structures are preferable, including, for example, a triphenylamine structure, an N,N'-diphenylbenzidine structure, an N,N'-1,4-phenylenediamine structure and a diphenyl naphthylamine structure. In particular, an N-phenylphenoxazine structure and an N-phenylphenothiazine structure, which belong to a crosslinked tertiary arylamine structure, are favorable.

The high molecular weight compound having a carrier transport property is favorable when it is a polymer having a repeating unit containing the above-mentioned structure singly or in combination of a plurality of kinds. Among these, polymers having a repeating unit containing at least one structure among the arylamine structure, the fluorene structure and the thiophene structure among the above-mentioned structures are likely to obtain an organic semiconductor composition capable of forming an organic thin film having uniform characteristics. Incidentally, when the high molecular weight compound has a plurality of kinds of repeating units in combination, it may contain a structure having continuously one repeating unit in the molecule.

In the case where repeating units contained in a high molecular weight compound are those composed only of a mononuclear or polynuclear aromatic hydrocarbon structure, a mononuclear or polynuclear heterocyclic structure or a tertiary arylamine structure and, furthermore, what is bonded to these repeating units is not an ethylene structure or an acetylene structure, in these repeating units, a carbon atom lying next to a carbon atom that forms a bonding hand with an adjacent structural unit is preferably unsubstituted (that is, only a hydrogen atom is bonded to a substitutable site) or substituted with a halogen atom. Among these, preferably the condition is to be satisfied in the case of a repeating unit composed of a mononuclear or polynuclear aromatic hydrocarbon structure and an adjacent structure is not an ethylene structure or an acetylene structure.

Furthermore, each of repeating units is particularly preferable when a part that is bonded to an adjacent structural unit has a 5-membered ring structure. For example, when a repeating unit is formed only from a mononuclear aromatic hydrocarbon structure or a mononuclear heterocyclic structure, the repeating unit itself preferably has a 5-membered ring structure. As the result that a repeating unit satisfies any of, or a plurality of conditions among these, a high molecular weight compound is one having a favorably formed conjugated unsaturated structure, and becomes one having furthermore a good carrier transport property.

As high molecular weight compounds having a carrier transport property, those having repeating units as a combination of (4a) to (4l) shown in the following Table 1 or 2 are particularly favorable. In Tables 1 and 2, it is meant that each of structures that are in the same row is combined as a repeating unit, and that fields that are shown as "-" include no repeating unit to be combined. Incidentally, all the signs in the general formulae in the tables have the same meanings as those described above. In the structures in the tables, when each of $R^{11}$, $R^{12}$, $R^{13}$ and $R^{14}$ exists in plural in the molecule, they may be same or different.

TABLE 1

| HIGH MOLECULAR WEIGHT COMPOUND | COMBINATION OF REPEATING UNITS | | |
|---|---|---|---|
| (4a) | 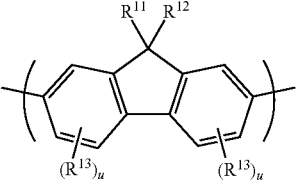 | — | — |
| (4b) | 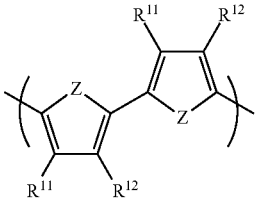 | | — |
| (4c) | 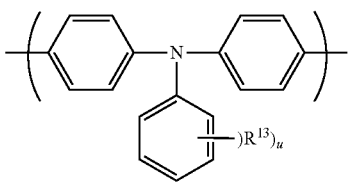 | | — |

TABLE 1-continued

| HIGH MOLECULAR WEIGHT COMPOUND | COMBINATION OF REPEATING UNITS | | |
|---|---|---|---|
| (4d) | fluorene unit with R¹¹, R¹² at 9-position and (R¹³)ᵤ substituents | thiophene-type unit with Z, R¹¹, R¹² | ETHYLENE |
| (4e) | cyclopentadithiophene unit with R¹¹, R¹², R¹⁴ | thiophene-type unit with Z, R¹¹, R¹² | — |
| (4f) | cyclopentadithiophene unit with R¹¹, R¹², R¹⁴ | benzothiadiazole unit with R¹¹, R¹² | — |

TABLE 2

| HIGH MOLECULAR WEIGHT COMPOUND | COMBINATION OF REPEATING UNITS | | |
|---|---|---|---|
| (4g) | thiophene-type unit with Z, R¹¹, R¹² | — | — |
| (4h) | thiophene-type unit with Z, R¹¹, R¹² | thienothiophene unit with Z, R¹¹, R¹² | — |
| (4i) | thiophene-type unit with Z, R¹¹, R¹² | bicyclic unit with Z, R¹¹, R¹² | — |
| (4j) | benzodithiophene unit with Z, R¹¹, R¹², R¹⁴ | — | — |

TABLE 2-continued

| HIGH MOLECULAR WEIGHT COMPOUND | COMBINATION OF REPEATING UNITS | | |
|---|---|---|---|
| (4k) | 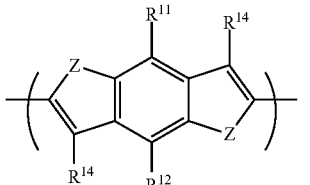 | 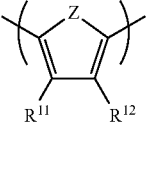 | — |
| (4l) | 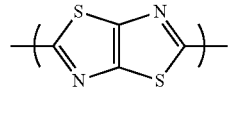 | 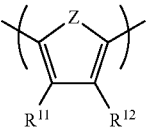 | — |

As high molecular weight compounds having a combination of these (4a) to (4l), more specifically, polymers having a structure represented in the following Table 3 or 4 are favorable. Among these, as the high molecular weight compound, polymers having the combination of (4a), (4b), (4c) and (4d) in Table 1 are preferable, and each of these corresponds to polymers represented by (5a), (5b), (5c) and (5d) in the following Table 3.

Note that, each of m's in Table 3 is an integer of one or more, and, as the range of m, a range that leads to a polymer having weight average molecular weight (a value in terms of polystyrene) of not less than 8,000 is preferable, a range of 10,000 to 1,000,000 is more preferable, and a range of 30,000 to 500,000 is furthermore preferable. Further, number average molecular weight (a value in terms of polystyrene) is preferably from 18,000 to 500,000, more preferably from 20,000 to 450,000.

TABLE 3

| COMBINATION | POLYMER |
|---|---|
| (5a) | 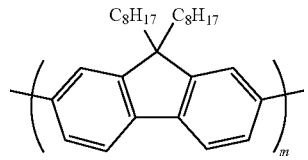 |
| | 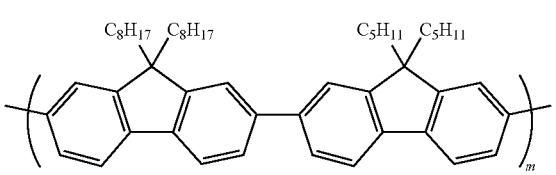 |
| (5b) | 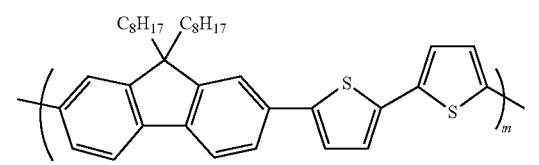 |
| (5c) | 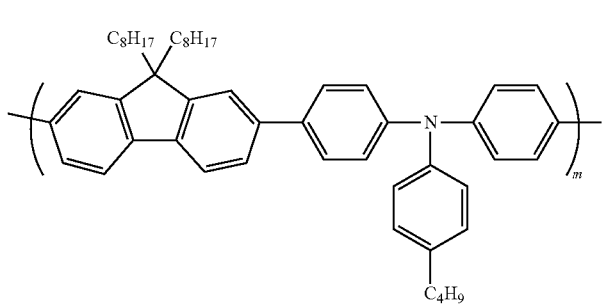 |

TABLE 3-continued
| COMBINATION | POLYMER |
|---|---|
| | 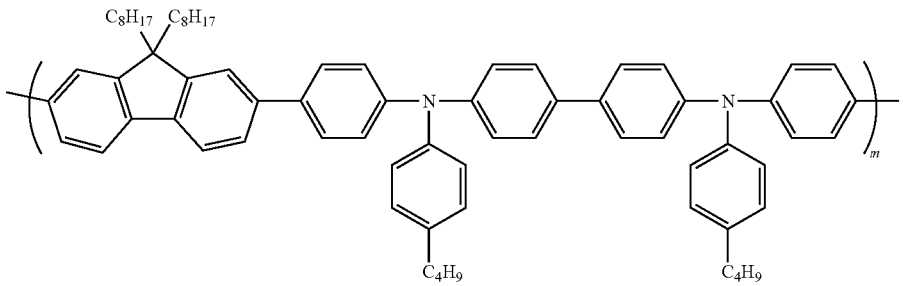 |
| (5d) | 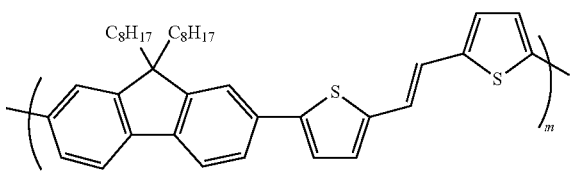 |
| (5e) | 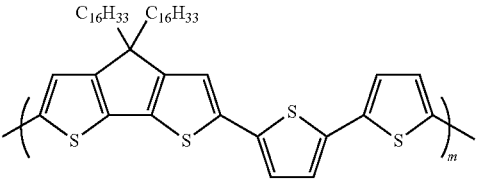 |
| (5f) | 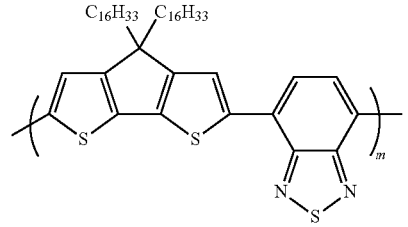 |
TABLE 4
| COMBINATION | POLYMER |
|---|---|
| (5g) | 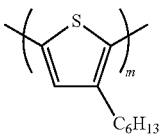 |
| | 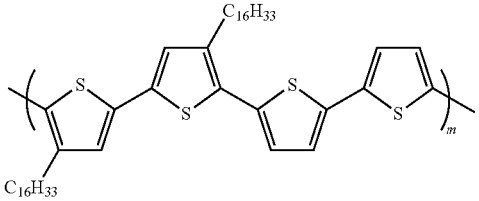 |

TABLE 4-continued

| COMBINATION | POLYMER |
|---|---|
| (5h) | 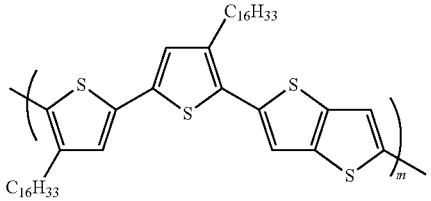 |
| (5i) | 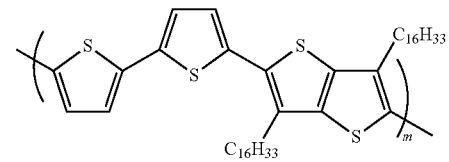 |
| (5j) | 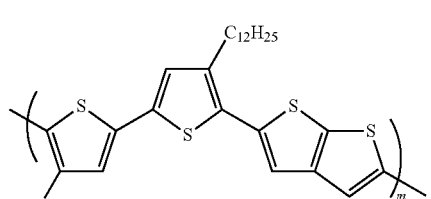 |
| (5k) | 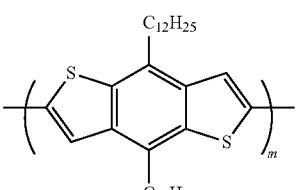 |
| (5l) | 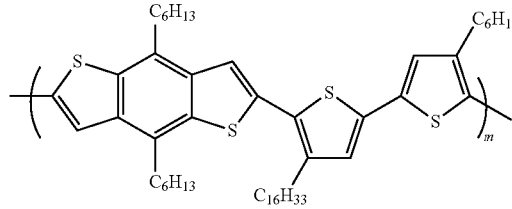 |

Incidentally, an end structure (an end group) of the high molecular weight compound has not been described in particular, but, from the viewpoint of obtaining sufficiently characteristics and durability when the compound is formed into an organic thin film device using an organic thin film composed of the organic semiconductor composition, the end structure of the high molecular weight compound is preferably a stable structure. Accordingly, for example, as polymers described above, when there exists an instable end group in the synthesis thereof, one obtained after substituting the instable end group with a more stable end group, or after protecting the group is more favorable.

Examples of the stable end groups include, in addition to a hydrogen atom and a fluorine atom, a saturated or unsaturated hydrocarbon group, an aryl group, a heteroaryl group, an alkoxy group, an amino group, a carbonyl group, a nitro group, a hydroxyl group, a cyano group, an arylalkyl group, a heteroarylalkyl group, an aryloxy group, a heteroaryloxy group and an alkylsilyl group. These groups may further have an arbitrary substituent and examples of the substituent include those exemplified as these end groups etc.

Moreover, as the end group, from the viewpoint of enhancing the solubility of the high molecular weight compound in an organic solvent etc. to simplify coating etc. of the organic semiconductor composition, a saturated or unsaturated hydrocarbon group, a saturated or unsaturated hydrocarbon group in which a part or all of the hydrogen atoms have been substituted with an alkoxy group or a fluorine atom, and an alkoxy group are preferable. Furthermore, as an end group, for example, one capable of forming a conjugated structure continuously to the main chain forming the conjugated structure of a high molecular weight compound is also preferable. Examples of such end groups include those containing an aryl group or a heteroaryl group (a heterocyclic group) bonded to the main chain via a carbon-carbon bond. Incidentally, when a high molecular weight compound has a plurality of end groups, they may be same or different from each other.

The organic semiconductor composition contains at least above-mentioned low molecular weight compound, and high molecular weight compound having a carrier transport property, but, in addition to these, the composition may contain other components. The content of other component is preferably set at a level that does not extremely inhibit the carrier transport property and uniformity, and, for example, may be set to be not more than 30% by mass in the total amount of the composition.

Examples of other components include high molecular weight compounds having no carrier transport property. As the high molecular weight compound having no carrier transport property, unconjugated high molecular weight compounds may be exemplified, among which those that do not extremely inhibit a carrier transport property when being formed into an organic thin film are preferable, and, those that have not strong absorption of visible light are also preferable.

Examples of the unconjugated high molecular weight compounds include polystyrenes (polystyrene, isotactic polystyrene, poly(α-methylstyrene) etc.), polyethylenes (HD polyethylene etc.), polypropylene, polyisoprene, polybutadiene, poly(4-methyl-1-pentene), poly(tetrafluoroethylene), polycarbonate, polyacrylate, polymethyl acrylate, polymethyl methacrylate, polyvinyl chloride etc. An unconjugated high molecular weight compound may be a copolymer (random copolymer, block copolymer) having repeating units of these compounds in combination of a plurality of kinds.

Moreover, the organic semiconductor composition may further contain materials for making various functions be expressed as other components. Examples thereof include a sensitizer that sensitizes a function of generating charges by light having been absorbed, a stabilizer that improves the stability of the composition or the organic thin film, a UV-absorbing agent for absorbing UV (ultra violet) light, etc.

The organic semiconductor composition of the present invention contains the high molecular weight compound having a carrier transport property, the low molecular weight compound represented by Formula (1) and other components, if necessary, in combination, and may have a composition that contains only every one kind of these or a composition in which a part or all of the components are contained in a plurality of kinds.

In the organic semiconductor composition, the content ratio of the high molecular weight compound having a carrier transport property is preferably from 5 to 95 parts by mass relative to a total of 100 parts by mass of the high molecular weight compound and the low molecular weight compound represented by Formula (1), more preferably either from not less than 5 parts by mass to less than 30 parts by mass or from more than 70 parts by mass to not more than 95 parts by mass, furthermore preferably from not less than 5 parts by mass to less than 30 parts by mass. When the ratio of the high molecular weight compound lies in the range, the improvement effect of a carrier transport property tends to become higher, and more uniform characteristics tend to be obtained.

[Organic Semiconductor Ink]

From the viewpoint of facilitating works such as coating, the organic semiconductor composition of the above-mentioned embodiment can be formed into an organic semiconductor ink. The organic semiconductor ink contains, for example, the organic semiconductor composition and a solvent, and may include furthermore other additives. The organic semiconductor composition can be dissolved in the solvent in 0.1% by weight or more.

The organic semiconductor ink preferably has a viscosity favorable for a coating method to be described later. Since the organic semiconductor composition of a favorable embodiment includes, in addition to the low molecular weight compound represented by Formula (1), the high molecular weight compound having a carrier transport property in combination, for example, by adjusting the composition of combination of these, it is possible to adjust broadly the viscosity of the organic semiconductor ink.

As described above, in the organic semiconductor ink of the present embodiment, the viscosity may be adjusted independently of the kind and amount of the solvent, and thus a degree of freedom of solvent selection becomes high. Further, since the ink can be adjusted with a high degree of freedom, for example, even for a substrate which has a large surface free energy to give, in a usual state, too large a contact angle (for example, 90° or more) with the coating liquid and thus for which coating is difficult, formation of the organic thin film becomes possible by performing appropriate adjustment. As the result, according to the organic semiconductor ink of the present embodiment, it becomes possible to form satisfactorily an organic thin film that is substantially homogeneous and, in addition, has a high carrier transport property in the manufacturing of organic thin film devices.

[Organic Thin Film]

Next, as the organic thin film composed of the organic semiconductor composition of above-mentioned embodiment, an organic thin film obtained employing the organic semiconductor ink will be described as an example.

The organic thin film is a thin film composed of the organic semiconductor composition. The thickness of the organic thin film is preferably from 1 nm to 100 μm, more preferably from 2 nm to 1000 nm, furthermore preferably from 5 nm to 500 nm, and particularly preferably from 20 nm to 200 nm. Organic thin films having such a thickness make it possible to form easily organic thin film devices having a good carrier transport property and sufficient strength etc.

The organic thin film can be formed, such as by coating an organic semiconductor ink (a coating liquid) onto a prescribed substrate. Examples of the coating methods of the organic semiconductor ink include a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an ink jet printing method, a dispenser printing method, a micro contact printing method, a nozzle coat method, a capillary coat method etc. Among these, the spin coat method, the gravure coat method, the screen printing method, the flexo printing method, the offset printing method, the ink jet printing method, the dispenser printing method, the micro contact printing method, the nozzle coat method or the capillary coat method is preferable.

Incidentally, the coating may be implemented in a heated state. This makes it possible to coat a high concentration ink and to form more homogeneous thin film, and, in addition, to select and use a material that is difficult to be coated at room temperature, or the like. The coating in a heated state can be implemented, for example, by using a pre-heated coating liquid or implementing coating while heating the substrate.

Viscosities of an organic semiconductor ink favorable for the above-described coating method are, for example, preferably from 0.01 to 1 Pa·s and more preferably from 0.05 to 0.2 Pa·s in the gravure coat method, preferably from 0.1 to 100 Pa·s and more preferably from 0.5 to 50 Pa·s in the screen printing method, preferably from 0.01 to 1 Pa·s and more preferably from 0.05 to 0.5 Pa·s in the flexo printing method, preferably from 1 to 500 Pa·s and more preferably from 20 to 100 Pa·s in the offset printing method, and preferably not more than 0.1 Pa·s and more preferably not more than 0.02 Pa·s in the ink jet printing method. The viscosity of the organic semiconductor ink can be adjusted by setting appropriately the ratio between the high molecular weight compound having a carrier transport property and the low molecular weight compound represented by Formula (1), or selecting the kind of the high molecular weight compound, a solvent etc. to be used.

The process of forming the organic thin film as described above can also be implemented as a process in the manufacturing of an organic thin film device. In this case, for example, a substrate over which the organic thin film is to be formed serves as a structural body generated in the manufacturing process of the organic thin film device. In an organic thin film device, from the viewpoint of furthermore enhancing a carrier transport property of the organic thin film, a process for giving prescribed alignment may furthermore be implemented for the organic thin film thus formed. In the aligned organic thin film, since molecules in the organic semiconductor composition constituting the film are aligned in one direction, the carrier transport property tends to be furthermore enhanced.

As the aligning method, for example, methods known as a technique for aligning a liquid crystal can be employed. Among these, a rubbing method, a photo-alignment method, a shearing method (a shear stress-applying method), a draw up coating method etc. are easy to be utilized because they are simple as an aligning method, and, in particular, the rubbing method or the shearing method is preferable.

[Organic Thin Film Device]

Organic thin films composed of the organic semiconductor composition of a favorable embodiment can exhibit a high carrier (electrons or holes) transport property, and therefore can transport electrons or holes injected from an electrode provided for these organic thin films, or charges generated by light absorption. In addition, in the manufacturing, since the viscosity or the like of the organic semiconductor ink is controlled easily and, furthermore, crystallization hardly occurs, uniform characteristics can be obtained even when the area is made large. Accordingly, while taking advantages of these, they can be applied to various organic thin film devices such as organic thin film transistors, organic solar cells, and photosensors. Hereinafter, these organic thin film devices will be described individually.

(Organic thin film transistor) As an organic thin film transistor employing above-mentioned organic thin film, one having such a configuration that includes a source electrode and a drain electrode, an organic semiconductor layer (an active layer) that serves as a current path between these electrodes, and a gate electrode that controls an amount of current flowing through the current path is mentioned, in which the organic semiconductor layer is constituted with the organic thin film composed of above-mentioned organic semiconductor composition. Such organic thin film transistors include a field-effect type, an electrostatic induction type etc.

The field-effect type organic thin film transistor preferably includes a source electrode and a drain electrode, an organic semiconductor layer (an active layer) that serves as a current path between these, a gate electrode that controls an amount of current flowing through the current path, and an insulating layer disposed between the organic semiconductor layer and the gate electrode. In particular, it is preferable that the source electrode and the drain electrode are provided in contact with the organic semiconductor layer (the active layer), and that, furthermore, the gate electrode is provided, sandwiching the insulating layer in contact with the organic semiconductor layer. In the field-effect type organic thin film transistor, the organic semiconductor layer is constituted with the organic thin film composed of the organic semiconductor composition of the favorable embodiment.

The electrostatic induction type organic thin film transistor has a source electrode and a drain electrode, an organic semiconductor layer (an active layer) that serves as a current path between these, and a gate electrode that controls an amount of current flowing through the current path, in which the gate electrode is preferably provided in the organic semiconductor layer. In particular, the source electrode, the drain electrode, and the gate electrode provided in the organic semiconductor layer are preferably provided in contact with the organic semiconductor layer. Here, as the structure of the gate electrode, a structure, in which a current path flowing from the source electrode to the drain electrode is formed and a voltage applied to the gate electrode can control the amount of current flowing through the current path, is sufficient, and, for example, a comb-shaped electrode is mentioned. In the electrostatic induction type organic thin film transistor, too, the organic semiconductor layer is constituted with the organic thin film composed of the organic semiconductor composition of the favorable embodiment.

FIG. 1 is a schematic cross-sectional view of the organic thin film transistor (the field-effect type organic thin film transistor) according to a first embodiment. An organic thin film transistor 100 shown in FIG. 1 includes a substrate 1, a source electrode 5 and a drain electrode 6 formed on the substrate 1 with a prescribed space, an organic semiconductor layer 2 formed over the substrate 1 so as to cover the source electrode 5 and the drain electrode 6, an insulating layer 3 formed on the organic semiconductor layer 2, and a gate electrode 4 formed on the insulating layer 3 so as to cover the region of the insulating layer 3 between the source electrode 5 and the drain electrode 6.

Figure 2:
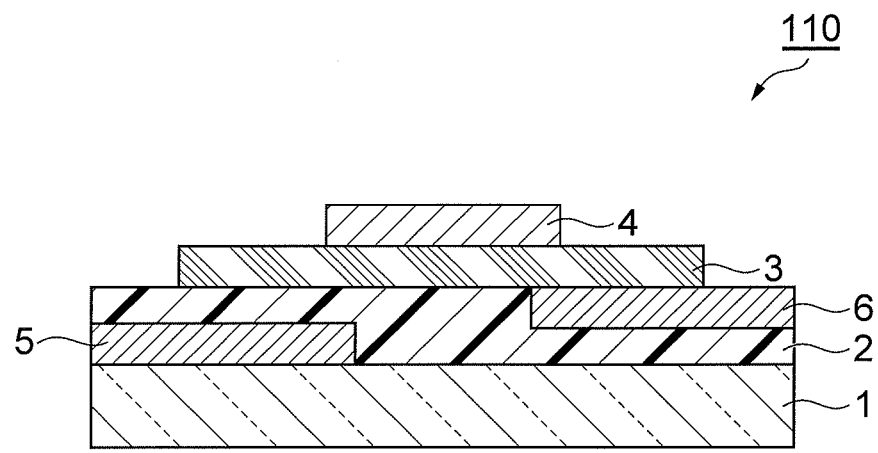
FIG. 2 is a schematic cross-sectional view of an organic thin film transistor according to a second embodiment.

FIG. 2 is a schematic cross-sectional view of the organic thin film transistor (the field-effect type organic thin film transistor) according to a second embodiment. An organic thin film transistor 110 shown in FIG. 2 includes the substrate 1, the source electrode 5 formed on the substrate 1, the organic semiconductor layer 2 formed over the substrate 1 so as to cover the source electrode 5, the drain electrode 6 formed on the organic semiconductor layer 2 with a prescribed space from the source electrode 5, the insulating layer 3 formed on the organic semiconductor layer 2 and the drain electrode 6, and the gate electrode 4 formed on the insulating layer 3 so as to cover the region of the insulating layer 3 between the source electrode 5 and the drain electrode 6.

Figure 3:
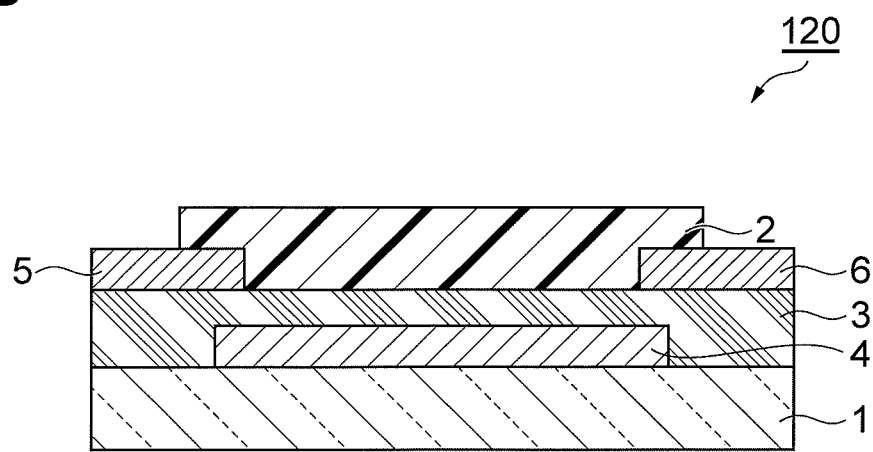
FIG. 3 is a schematic cross-sectional view of an organic thin film transistor according to a third embodiment.

FIG. 3 is a schematic cross-sectional view of the organic thin film transistor (the field-effect type organic thin film transistor) according to a third embodiment. An organic thin film transistor 120 shown in FIG. 3 includes the substrate 1, the gate electrode 4 formed on the substrate 1, the insulating layer 3 formed over the substrate 1 so as to cover the gate electrode 4, the source electrode 5 and the drain electrode 6 formed on the insulating layer 3 with a prescribed space so as to cover a part of the region of the insulating layer 3 under which the gate electrode 4 is formed, and the organic semiconductor layer 2 formed over the insulating layer 3 so as to cover a part of the source electrode 5 and drain electrode 6.

Figure 4:
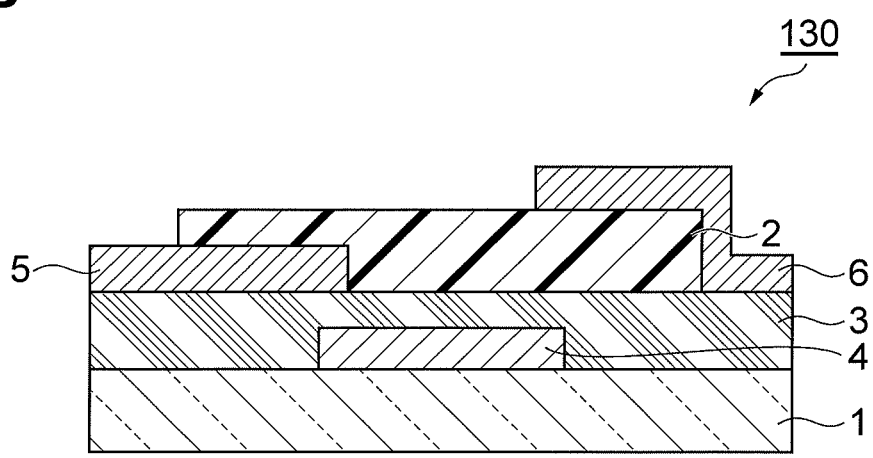
FIG. 4 is a schematic cross-sectional view of an organic thin film transistor according to a fourth embodiment.

FIG. 4 is a schematic cross-sectional view of the organic thin film transistor (the field-effect type organic thin film transistor) according to a fourth embodiment. An organic thin film transistor 130 shown in FIG. 4 includes the substrate 1, the gate electrode 4 formed on the substrate 1, the insulating layer 3 formed over the substrate 1 so as to cover the gate electrode 4, the source electrode 5 formed on the insulating layer 3 so as to cover a part of the region of the insulating layer 3 under which the gate electrode 4 is formed, the organic semiconductor layer 2 formed over the insulating layer 3 so as to cover a part of the source electrode 5, and the drain electrode 6 formed over the insulating layer 3 with a prescribed space from the source electrode 5 so as to cover a part of the region of organic semiconductor layer 2 under which the gate electrode 4 is formed.

Figure 5:
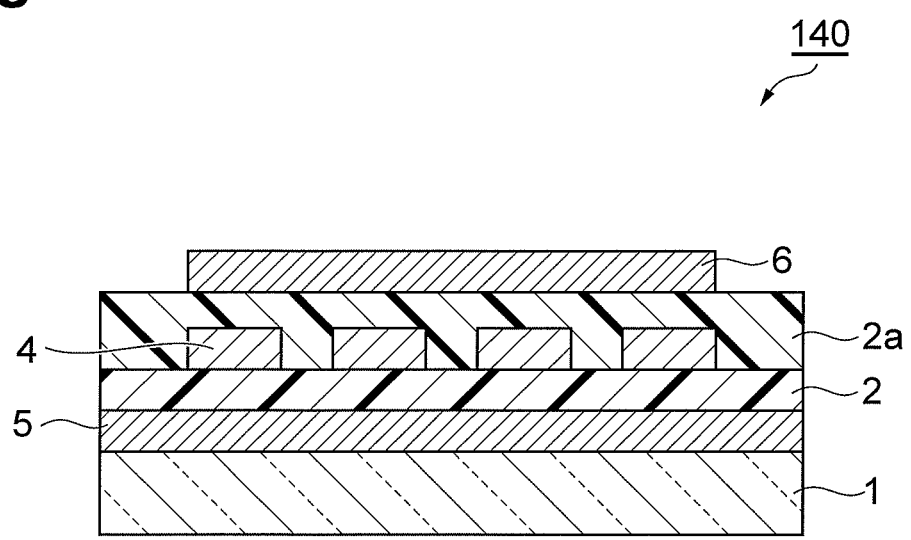
FIG. 5 is a schematic cross-sectional view of an organic thin film transistor according to a fifth embodiment.

FIG. 5 is a schematic cross-sectional view of the organic thin film transistor (the electrostatic induction type organic thin film transistor) according to a fifth embodiment. An organic thin film transistor 140 shown in FIG. 5 includes the substrate 1, the source electrode 5 formed on the substrate 1, the organic semiconductor layer 2 formed on the source electrode 5, the gate electrodes 4 formed on the organic semiconductor layer 2 in plural with a prescribed space, an organic semiconductor layer 2a (a material constituting the organic semiconductor layer 2a may be the same as or different from that of the organic semiconductor layer 2) formed over the organic semiconductor layer 2 so as to cover all of the gate electrodes 4, and the drain electrode 6 formed on the organic semiconductor layer 2a.

Figure 6:
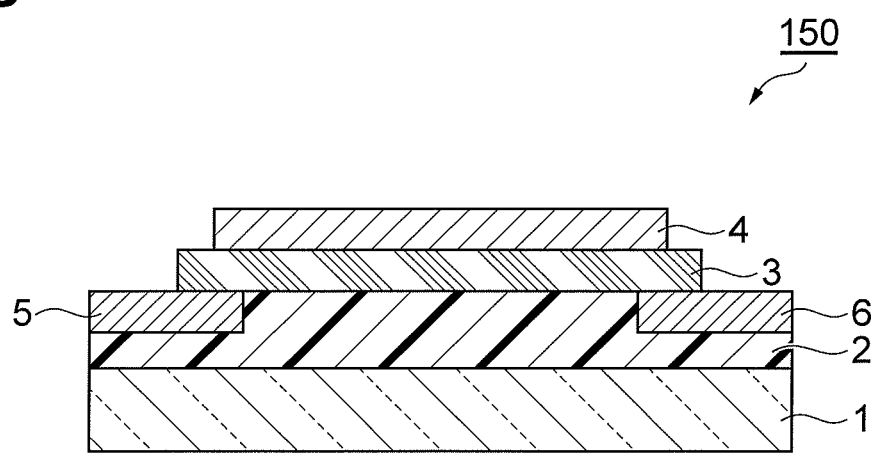
FIG. 6 is a schematic cross-sectional view of an organic thin film transistor according to a sixth embodiment.

FIG. 6 is a schematic cross-sectional view of the organic thin film transistor (the field-effect type organic thin film transistor) according to a sixth embodiment. An organic thin film transistor 150 shown in FIG. 6 includes the substrate 1, the organic semiconductor layer 2 formed on the substrate 1, the source electrode 5 and the drain electrode 6 formed on the organic semiconductor layer 2 with a prescribed space, the insulating layer 3 formed over the organic semiconductor layer 2 so as to cover a part of the source electrode 5 and the drain electrode 6, and the gate electrode 4 formed over the insulating layer 3 so as to cover a part of each of the region of the insulating layer 3 under which the source electrode 5 is formed and the region of the insulating layer 3 under which the drain electrode 6 is formed.

Figure 7:
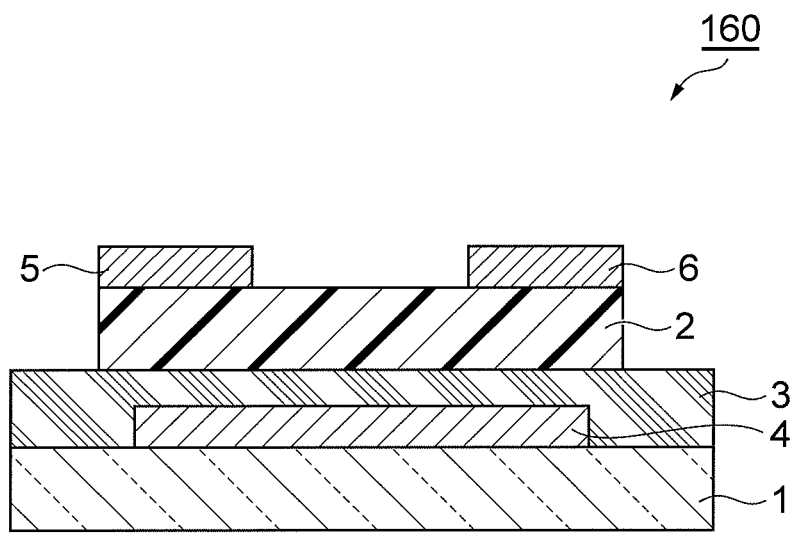
FIG. 7 is a schematic cross-sectional view of an organic thin film transistor according to a seventh embodiment.

FIG. 7 is a schematic cross-sectional view of the organic thin film transistor (the field-effect type organic thin film transistor) according to a seventh embodiment. An organic thin film transistor 160 shown in FIG. 7 includes the substrate 1, the gate electrode 4 formed on the substrate 1, the insulating layer 3 formed over the substrate 1 so as to cover the gate electrode 4, the organic semiconductor layer 2 formed so as to cover the region of the insulating layer 3 under which the gate electrode 4 is formed, the source electrode 5 formed on the organic semiconductor layer 2 so as to cover a part of the region of the organic semiconductor layer 2 under which the gate electrode 4 is formed, and the drain electrode 6 formed on the organic semiconductor layer 2 with a prescribed space from the source electrode 5 so as to cover a part of the region of the organic semiconductor layer 2 under which the gate electrode 4 is formed.

In the organic thin film transistors according to the first to seventh embodiments, the organic semiconductor layer 2 and/or organic semiconductor layer 2a is constituted with the organic thin film composed of the organic semiconductor composition of above-described favorable embodiments, and serves as a current path (a channel) between the source electrode 5 and the drain electrode 6. Further, the gate electrode 4 controls the amount of current flowing through the current path (the channel) in the organic semiconductor layer 2 and/or organic semiconductor layer 2a by applying a voltage.

Among above-described respective organic thin film transistors, the field-effect type organic thin film transistor can be manufactured by a known method, for example, a method described in Japanese Patent Laid-Open No. 05-110069. The electrostatic induction type organic thin film transistor can be manufactured by a known method, for example, a method described in Japanese Patent Laid-Open No. 2004-006476.

No particular limitation is imposed on the substrate 1 when it does not inhibit characteristics as an organic thin film transistor, and a glass substrate, a flexible film substrate and plastic substrate may be employed.

When forming the organic semiconductor layer 2, as the high molecular weight compound having a carrier transport property and the low molecular weight compound represented by Formula (1), the employment of compounds soluble in an organic solvent is preferable from the viewpoint of facilitating the manufacturing. Accordingly, it is favorable to form an organic thin film to be the organic semiconductor layer 2, for example, using the method for manufacturing the organic thin film as described in above-mentioned embodiments.

As the insulating layer 3 in contact with the organic semiconductor layer 2, those known as materials having high electrical insulating properties can be employed. Examples thereof include $SiO_x$, $SiN_x$, $Ta_2O_5$, polyimide, polyvinyl alcohol, polyvinyl phenol, organic glass, photoresist etc. From the viewpoint of making a voltage low, a material having high dielectric constant is more preferable.

When the organic semiconductor layer 2 is to be formed on the insulating layer 3, it is also possible to treat the surface of the insulating layer 3 with a surface treatment agent such as a silane coupling agent to modify the surface in order to improve the interface characteristics between the insulating layer 3 and the organic semiconductor layer 2 and, after that, to form the organic semiconductor layer 2.

In the case of the field-effect type organic thin film transistor, carriers such as electrons and holes pass generally near the interface between the insulating layer and the organic semiconductor layer. Accordingly, the state of the interface gives large influence on the mobility of the transistor. In this regard, as a method for improving the interface state to enhance the characteristics, a control of an interface with a silane coupling agent is known (for example, Surface Science Vol. 28, No. 5, pp 242-248, 2007).

Examples of the silane coupling agents include alkyl chlorosilanes (octyl trichlorosilane (OTS), octadecyl trichlorosilane (ODTS), phenyl ethyl trichlorosilane, etc.), alkyl alkoxysilanes, fluorinated alkyl chlorosilanes, fluorinated alkyl alkoxysilanes, and silylamine compounds such as hexamethyl disilazane (HMDS), etc. It is also possible to treat the surface of the insulating layer with an ozone UV and $O_2$ plasma, prior to the treatment with a surface treatment agent.

By the treatment, it is possible to control the surface energy of a silicon oxide film that is employed as an insulating layer.

Additionally, sometimes, the surface treatment improves alignment properties of the organic semiconductor composition on the insulating layer, the composition constituting the organic semiconductor layer, and, consequently, a high carrier transport property (mobility) can be obtained. For example, conventionally, it is known that pentacene deposited by an evaporation method forms an arrangement in which molecules are stacked approximately upright in a herringbone structure on the surface-treated substrate.

However, conventionally, in the organic semiconductor compounds for forming an organic thin film by coating, occasionally, a treatment with a silane coupling agent increased water-repellent properties of the surface on which a thin film was to be formed (a surface to be coated), resulting in that a thin film was not produced uniformly. This is considered that the increase in surface energy makes large contact angle between the organic semiconductor composition and the surface to be coated, resulting in poor wettability.

Consequently, when a thin film is to be formed for an insulating layer having been subjected to above-mentioned surface treatment, in the case of an ink jet method etc., a so-called coffee stain phenomenon, in which the thickness of the film to be formed becomes thinner from an outer peripheral part toward a central part, became remarkable. In addition, in a thin film formation by a spin coat method, there was such a case that the material was splashed not to form a thin film at all.

In contrast, since the organic semiconductor composition for use in the present embodiment contains the high molecular weight compound having a carrier transport property and the low molecular weight compound represented by Formula (1) in combination, as described above in the formation of the organic thin film, the wettability and viscosity of the coating liquid are controlled easily. Accordingly, even for a surface to be coated having been subjected to a surface treatment with a silane coupling agent etc., it is easy to form an organic semiconductor layer with high quality. Consequently, characteristics due to the organic semiconductor layer such as mobility tends to be improved considerably.

As the gate electrode 4, materials such as metals as gold, platinum, silver, copper, chromium, palladium, aluminum, indium, molybdenum, low resistance polysilicon and low resistance amorphous silicon, tin oxide, indium oxide, indium-tin oxide (ITO) can be employed. These materials can be employed in one kind independently or in combination of two or more kinds. Incidentally, as the gate electrode 4, a silicon substrate doped in high concentration may be employed. The silicon substrate doped in high concentration has both a property as a gate electrode and a property as a substrate. When the gate electrode 4 that also has a property as a substrate is to be employed, in organic thin film transistors in which the substrate 1 is in contact with the gate electrode 4, the substrate 1 may be omitted. For example, in the organic thin film transistor of above-mentioned third embodiment, when a constitution, in which the gate electrode 4 also serves as the substrate 1, is adopted, such organic thin film transistor has a construction, for example, shown in FIG. 13.

The source electrode 5 and the drain electrode 6 are preferably constituted from a low resistance material, and, for example, are particularly preferably constituted from gold, platinum, silver, copper, chromium, palladium, aluminum, indium, molybdenum etc. These materials may be used in one kind independently or in combination of two or more kinds.

Hereinbefore, some examples are described as organic thin film transistors of favorable embodiments, but organic thin film transistors are not limited to above-mentioned embodiments. For example, a layer composed of a metal or a compound different from the organic semiconductor compound, (preferably a compound different from the organic semiconductor compound) may lie between the source electrode 5 and drain electrode 6, and the organic semiconductor layer 2. Consequently, there is such a case that contact resistance between the source electrode 5 and drain electrode 6, and the organic semiconductor layer 2 is reduced to furthermore enhance carrier mobility of the organic thin film transistor.

Examples of the layers include layers composed of a low molecular weight compound having electron or hole transportability, an alkali metal, an alkali earth metal, a rare earth metal and a complex of these metals and an organic compound etc., a typical metal, an oxide or a chalcogenide of a metal, an alkylthiol compound, an aromatic thiol compound such as aromatic thiols or fluorinated alkyl aromatic thiols, etc.

Moreover, after producing the organic thin film transistor as described above, in order to protect the device, it is preferable to form a protective film on the organic thin film transistor. This makes it possible to block the organic thin film transistor from the air and to suppress the deterioration in characteristics of the organic thin film transistor. Further, when a display device that is driven on the organic thin film transistor is to be formed, the protective film can also reduce the influence on the organic thin film transistor in the formation process of the display device.

Examples of a method for forming the protective film include methods of covering the organic thin film transistor with a UV-curable resin, a heat-curable resin, an inorganic SiONx film or the like. In order to implement effectively the blocking from the air, it is preferable to implement processes between the production of the organic thin film transistor and the formation of the protective film without exposing the transistor to the air (for example, in a dry nitrogen atmosphere, in vacuum, etc.).

An organic field-effect transistor, which is a kind of organic thin film transistor thus constituted, can be applied as a pixel driving switching device of an active matrix driving system liquid crystal display and an organic electroluminescence display, etc. In addition, since above-mentioned organic field-effect transistor of the embodiment includes, as the organic semiconductor layer, the organic thin film which is composed of above-mentioned organic semiconductor composition of the favorable embodiment, and which is excellent in a carrier transport property and has furthermore uniform characteristics, the field-effect mobility thereof becomes high. Accordingly, it is useful for manufacturing displays having a sufficient response speed, etc.

(Solar cell) Next, there will be described the application of the organic thin film according to the favorable embodiment of the present invention to a solar cell.

Figure 8:
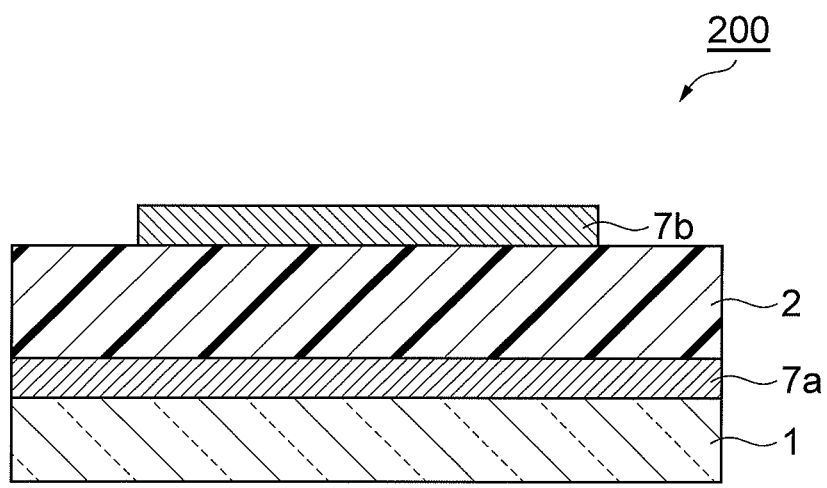
FIG. 8 is a schematic cross-sectional view of a solar cell according to an embodiment.

FIG. 8 is a schematic cross-sectional view of the solar cell according to the favorable embodiment. A solar cell 200 shown in FIG. 8 includes the substrate 1, a first electrode 7a formed on the substrate 1, the organic semiconductor layer 2 composed of an organic thin film formed on the first electrode 7a, and a second electrode 7b formed on the organic semiconductor layer 2. The organic thin film constituting the organic semiconductor layer 2 is formed of the organic semiconductor composition of the favorable embodiment.

In the solar cell according to the present embodiment, a transparent or translucent electrode is employed for one of the first electrode 7a and the second electrode 7b. As the material of the electrode, a metal such as aluminum, gold, silver, copper, an alkali metal, an alkali earth metal, or a translucent film or a transparent electroconductive film thereof can be employed. In order to obtain a high open voltage, it is preferable to select the material for each electrode so that the difference between work functions becomes large. Into the organic semiconductor layer 2 (the organic thin film), a charge generating agent, a sensitizer etc. may be added in order to enhance the optical sensitivity thereof. As the substrate 1, a silicon substrate, a glass substrate, a plastic substrate etc. may be employed.

Since the organic semiconductor layer 2 employing the organic thin film composed of the organic semiconductor composition of the favorable embodiment can exhibit a high carrier transport property, the solar cell having above-mentioned constitution can generate power efficiently.

(Photosensor) Next, there will be described the application of the organic thin film according to the favorable embodiment of the present invention to a photosensor.

Figure 9:
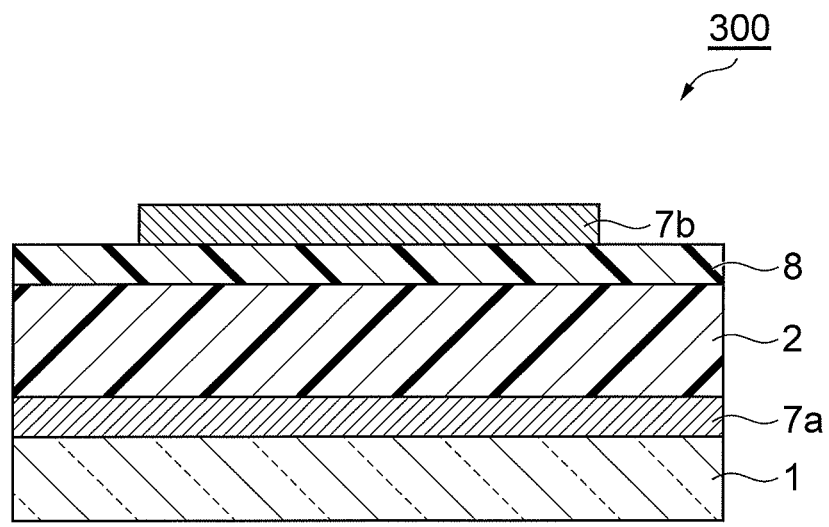
FIG. 9 is a schematic cross-sectional view of a photosensor according to the first embodiment.

FIG. 9 is a schematic cross-sectional view of the photosensor according to the first embodiment. A photosensor 300 shown in FIG. 9 includes the substrate 1, the first electrode 7a formed on the substrate 1, the organic semiconductor layer 2 composed of an organic thin film formed on the first electrode 7a, a charge generating layer 8 formed on the organic semiconductor layer 2, and the second electrode 7b formed on the charge generating layer 8. The organic thin film constituting the organic semiconductor layer 2 is formed of the organic semiconductor composition of the favorable embodiment.

Figure 10:
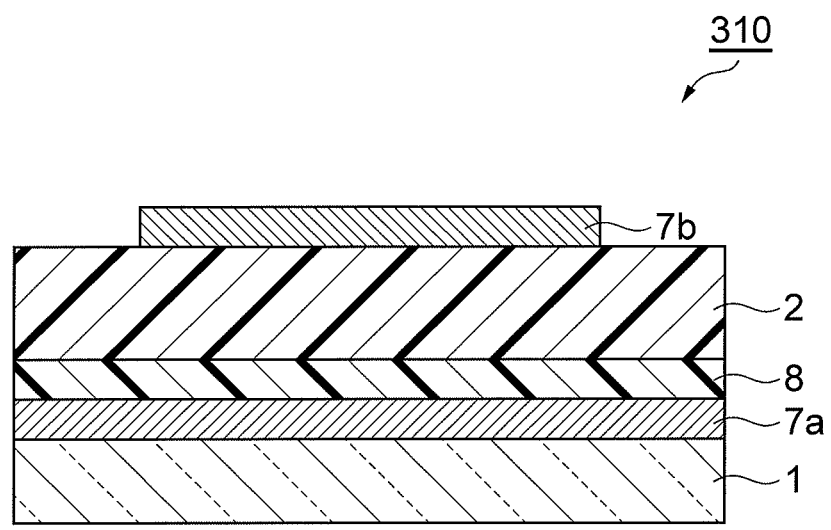
FIG. 10 is a schematic cross-sectional view of a photosensor according to the second embodiment.

FIG. 10 is a schematic cross-sectional view of the photosensor according to the second embodiment. A photosensor 310 shown in FIG. 10 includes the substrate 1, the first electrode 7a formed on the substrate 1, a charge generating layer 8 formed on the first electrode 7a, the organic semiconductor layer 2 composed of an organic thin film formed on the charge generating layer 8, and the second electrode 7b formed on the organic semiconductor layer 2. The organic thin film constituting the organic semiconductor layer 2 is formed of the organic semiconductor composition of the favorable embodiment.

Figure 11:
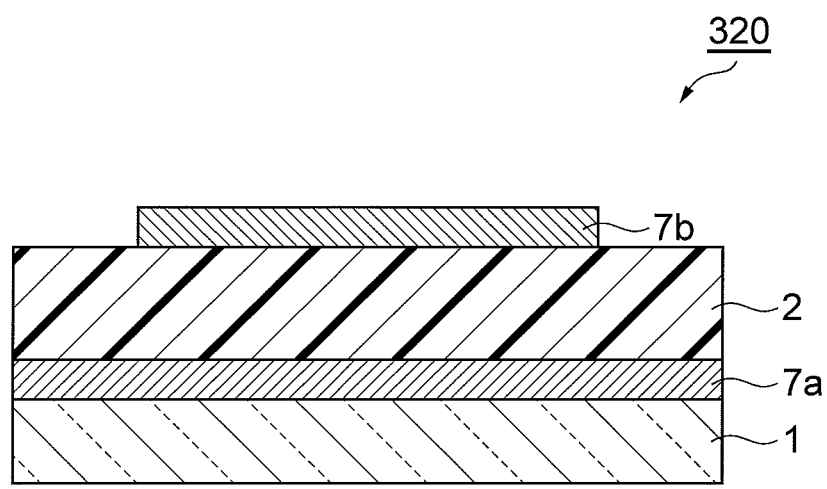
FIG. 11 is a schematic cross-sectional view of a photosensor according to the third embodiment.

FIG. 11 is a schematic cross-sectional view of the photosensor according to the third embodiment. A photosensor 320 shown in FIG. 11 includes the substrate 1, the first electrode 7a formed on the substrate 1, the organic semiconductor layer 2 composed of an organic thin film formed on the first electrode 7a, and the second electrode 7b formed on the organic semiconductor layer 2. The organic thin film constituting the organic semiconductor layer 2 is formed of the organic semiconductor composition of the favorable embodiment.

In the photosensors according to the first to third embodiments described above, a transparent or translucent electrode is employed for one of the first electrode 7a and the second electrode 7b. The charge generating layer 8 is a layer that generates charges by absorbing light. As an electrode material, a metal such as aluminum, gold, silver, copper, an alkali metal, an alkali earth or translucent film or transparent electroconductive film thereof may be employed. It is also possible to use the organic semiconductor layer 2 (the organic thin film) with the addition of a charge generating agent, a sensitizer etc. in order to enhance the optical sensitivity thereof. As the substrate 1, a silicon substrate, a glass substrate, a plastic substrate etc. may be employed.

Since the organic semiconductor layer 2 employing the organic thin film composed of the organic semiconductor composition of the favorable embodiment can exhibit a high carrier transport property, the photosensor having above-mentioned constitution can obtain high sensitivity.

(Organic electroluminescence device) Next, there will be described an organic electroluminescence device that employs above-mentioned organic thin film transistor.

The organic electroluminescence device includes at least two organic thin film transistors, that is, a driving transistor and a switching transistor. The organic electroluminescence device of the present invention employs the organic thin film transistor according to the favorable embodiment as described above, as at least one of the organic thin film transistors.

Figure 12:
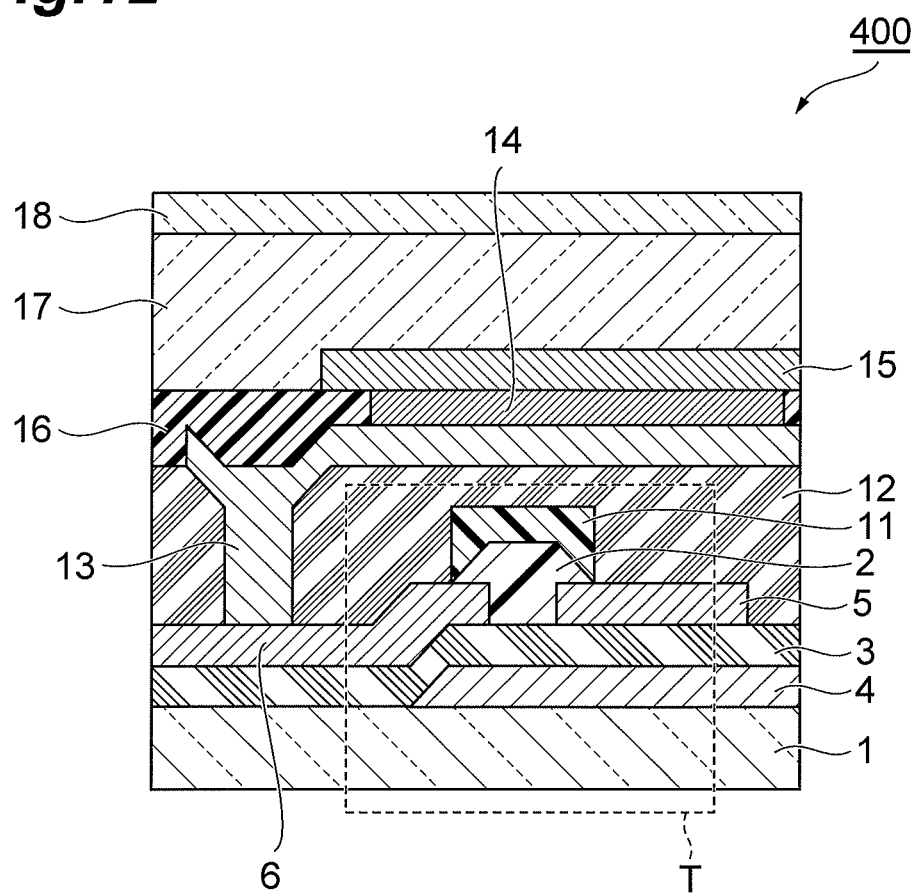
FIG. 12 is a schematic cross-sectional view of an organic electroluminescence device according to an embodiment.

FIG. 12 is an organic electroluminescence device according to the favorable embodiment. In an organic electroluminescence device 400 shown in FIG. 12, an organic thin film transistor T is constituted with the substrate 1, the gate electrode 4 formed on the substrate 1, the insulating layer 3 formed over the substrate 1 so as to cover the gate electrode 4, the source electrode 5 and the drain electrode 6 formed on the insulating layer 3 with a prescribed space so as to cover a part of the region of the insulating layer 3 under which the gate electrode 4 is formed, the organic semiconductor layer 2 formed over the insulating layer 3 so as to cover a part of the source electrode 5 and the drain electrode 6, and the protective film 11 formed on the organic semiconductor layer 2 so as to cover the whole of the organic semiconductor layer 2.

In addition, in the organic electroluminescence device 400, over the organic thin film transistor T, via an interlayer insulating film 12, a lower electrode (anode) 13, a light emitting element 14 and an upper electrode (cathode) 15 are stacked sequentially, in which the lower electrode 13 is connected electrically with the drain electrode 6 through a via hole provided in the interlayer insulating film 12. Further, around the lower electrode 13 and the light emitting element 14, a bank part 16 is provided. Furthermore, above the upper electrode 15, a substrate 18 is arranged, and a position between the upper electrode 15 and the substrate 18 is sealed with a sealing member 17.

In the organic electroluminescence device 400 shown in FIG. 12, the organic thin film transistor T functions as a driving transistor. In the organic electroluminescence device 400 shown in FIG. 12, a switching transistor is omitted.

In the organic electroluminescence device 400 according to the present embodiment, as the organic thin film transistor T, the organic thin film transistor of the favorable embodiment as described above is employed. As constitutional members other than it, constitutional members in known organic electroluminescence devices can be employed. Incidentally, as the upper electrode 15, the sealing member 17 and the substrate 18, transparent ones are employed.

In addition, while the organic electroluminescence device 400 shown in FIG. 12 functions as a planar light source by employing a white light emitting material, it is also possible to make the device function as a color display device by employing a red light emitting material, a blue light emitting material and a green light emitting material as the light emitting element 14, and by controlling the drive of each of the light emitting elements.

In order to obtain a pattern-shaped emission in such organic electroluminescence device, there are such methods as arranging a mask provided with a window of a patterned shape on the surface of a planar light emitting element, forming parts to be non-emitting of a light emitting layer constituting a light emitting element in an extremely thick state to make the parts be substantially non-emitting, and forming an anode or a cathode, or both electrodes in a patterned shape. By forming a pattern by any of these methods and arranging some electrodes so that they can independently be turned ON/OFF, a segment type display device, which can display numerals and characters, uncomplicated signs etc., is obtained.

Furthermore, in order to form a dot matrix device, it is sufficient to form both anode and cathode into a stripe shape and to arrange these so as to be orthogonal. Partially colored display or multicolor display becomes possible by a method of coating selectively a plurality of kinds of high molecular weight fluorescent materials having different emission colors, or a method of employing color filters or fluorescence conversion filters. Dot matrix devices may be passively driven, or actively driven in combination with a TFT or the like. These display devices can be employed as a display apparatus of computers, televisions, mobile terminals, mobile phones, car navigation systems, view finders of video cameras, etc.

Incidentally, as electric devices applied with the organic thin film transistor of the favorable embodiment, in addition to such organic electroluminescence devices, for example, electronic tags, liquid crystal display devices etc. are mentioned. Since these electric devices employ the organic thin film transistor of the favorable embodiment, due to the organic thin film transistor capable of exhibiting high and homogeneous transistor characteristics, the devices have stable and excellent operating characteristics.

EXAMPLES

Hereinafter, the present invention will be described furthermore in detail based on Examples, but the present invention shall not be limited to these Examples.

Example 1

First, each of the compound represented by Formula (8) (a high molecular weight compound (8)) as a high molecular weight compound having carrier transport property, and a compound represented by above-mentioned Formula (1d) (a low molecular weight compound (1d)) as a low molecular weight compound was prepared.

The high molecular weight compound (8) was synthesized by mixing such monomers as 9,9-dioctylfluorene-2,7-bis (dimethyl borate) and N,N-bis(4-bromophenyl)-N-(4-sec-butyphenyl) at a ratio of 50:50 and by a method described in Japanese Patent No. 4375820. The high molecular weight compound (8) had weight average molecular weight of 351,000 in terms of polystyrene, and number average molecular weight of 85,000. Incidentally, n in Formula (8) represents the repeating number of the structure in parentheses, which is the number corresponding to the case where the weight average molecular weight and the number average molecular weight of the compound give above-mentioned values. The same applies to n in Formulae shown below.

[Compound 9]

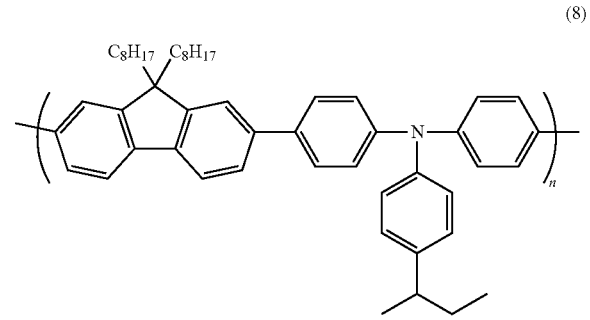

(8)

The low molecular weight compound (1d) was synthesized conforming to the method shown in WO 2005/087780A. Incidentally, a compound represented by Formula (1b) (a low molecular weight compound (1b)) and a compound represented by Formula (1c) (a low molecular weight compound (1c)) employed in the following Examples were also synthesized by the same method.

Figure 13:
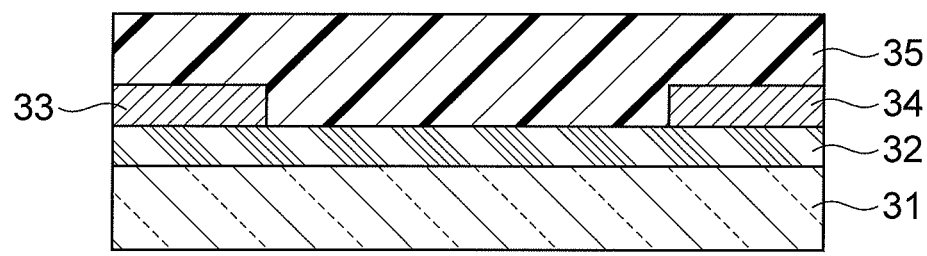
FIG. 13 is a schematic cross-sectional view of an organic thin film transistor produced in Example.

Subsequently, by use of an organic semiconductor composition containing the high molecular weight compound (8) and the low molecular weight compound (1d), an organic thin film transistor having a structure shown in FIG. 13 was produced.

In the manufacturing of the organic thin film transistor, first, the surface of a highly doped n-type silicon substrate 31 to be a gate electrode was thermally oxidized to form a silicon oxide film 32 of 200 nm. Next, on the silicon oxide film 32, a source electrode 33 and a drain electrode 34 (those in which chromium and gold were stacked in this order from the silicon oxide film side) having a channel length of 100 μm and a channel width of 1 mm were produced by a photolithographic process. The obtained substrate was subjected to ultrasonic cleaning with acetone for 10 min, and, after that, to ozone UV irradiation for 30 min. After that, the substrate was immersed in a toluene-diluted phenyl ethyl trichlorosilane liquid for 2 min, and thereby the substrate surface was silane-treated. Furthermore, the substrate was immersed in an isopropyl alcohol-diluted perfluorobenzenethiol liquid for 2 min, and thereby the surface of an electrode (gold) formed on the substrate was modified.

The high molecular weight compound (8) and the low molecular weight compound (1d) were dissolved in tetralin being a solvent to prepare a solution in which the concentration of the mixture of both compounds (an organic semiconductor composition) was 0.4% by weight, which was filtrated with a membrane filter to prepare a coating liquid (an organic semiconductor ink). Incidentally, the weight ratio of the high molecular weight compound (8) and the low molecular weight compound (1d) was set to be 1:1.

After that, the obtained coating liquid was coated on above-mentioned surface-treated substrate by a spin coat method, and dried on a hot plate at 110° C. for 3 min, and thereby an organic thin film (an organic semiconductor layer 35) that contained the high molecular weight compound (8) and the low molecular weight compound (1d) and had a thickness of about 30 nm was formed over the substrate so as to cover the source electrode 33 and the drain electrode 34.

The organic thin film transistor obtained as described above was produced in plural, and, for five devices among these, transistor characteristics were measured under such conditions that a source-drain voltage Vsd was set to be −40 V and a gate voltage Vg was varied from 20 to −40 V. From transfer characteristics obtained by the measurement, the median value of field-effect mobility (mobility) due to the organic thin film transistors of five devices was calculated to give 0.37 cm$^2$/Vs. In addition, a coefficient of variation (standard deviation÷average value×100) of the field-effect mobility (mobility) of five devices was 12.3%. It is meant that the smaller the coefficient of variation, the smaller the variation of the mobility among devices, that is, the organic thin film has uniform characteristics.

Comparative Example 1

An organic thin film transistor was produced in the same manner as in Example 1, except for employing the high molecular weight compound (8) alone as the constitutional material of the organic thin film. For five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.0032 cm$^2$/Vs, and the coefficient of variation was 14.7%. As described above, as compared with Example 1, Comparative Example 1 gave a comparable coefficient of variation but gave a significantly low mobility.

Example 2

An organic thin film transistor was produced in the same manner as in Example 1, except for employing the low molecular weight compound (1b) in place of the low molecular weight compound (1d). For five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.13 cm$^2$/Vs, and the coefficient of variation was 38.6%.

Example 3

An organic thin film transistor was produced in the same manner as in Example 1, except for employing a compound represented by Formula (9) (a high molecular weight compound (9)) as the high molecular weight compound having a carrier transport property. Incidentally, the high molecular weight compound (9) is a compound that gives a field-effect mobility of 0.0035 cm$^2$/Vs, when an organic thin film transistor with a structure shown in FIG. 13 including an organic thin film (an organic semiconductor layer) composed of only the compound.

In the synthesis of the high molecular weight compound (9), first, 9,9-dioctylfluorene-2,7-bis(dimethyl borate) and 5,5'-dibromo-2,2'-bithiophene being monomers were mixed at a ratio of 50:50, which was used for implementing a method described in Japanese Patent Laid-Open No. 2009-108228 to give the high molecular weight compound (9). The high molecular weight compound (9) had weight average molecular weight of 61,000 in terms of polystyrene, and number average molecular weight of 32,000.

[Compound 10]

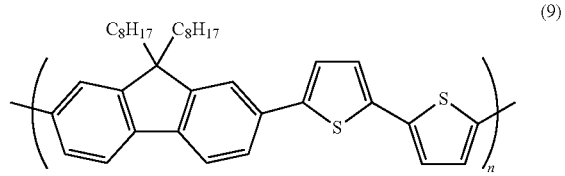

(9)

Then, for five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.46 cm$^2$/Vs, and the coefficient of variation was 3.7%.

Example 4

An organic thin film transistor was produced in the same manner as in Example 1, except for setting the weight ratio of the high molecular weight compound (8) and low molecular weight compound (1d) to be high molecular weight compound (8): low molecular weight compound (1d)=25:75. For five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.84 cm$^2$/Vs, and the coefficient of variation was 9.0%.

Example 5

An organic thin film transistor was produced in the same manner as in Example 1, except for setting the weight ratio of the high molecular weight compound (8) and the low molecular weight compound (1d) to be high molecular weight compound (8): low molecular weight compound (1d)=40:60. For five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.016 cm$^2$/Vs, and the coefficient of variation was 11.9%.

Comparative Example 2

An organic thin film transistor was produced in the same manner as in Example 1, except for using a high molecular weight compound represented by Formula (10) (an insulating high molecular weight compound (10), weight average molecular weight in terms of polystyrene: 18,100, number average molecular weight: 18,000), which is a high molecular weight compound having no carrier transport property, in place of the high molecular weight compound (8).

[Compound 11]

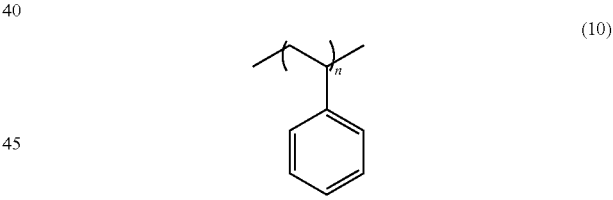

(10)

For five organic thin film transistors, transistor characteristics were measured under such conditions that the source-drain voltage Vsd was set to be −40 V and the gate voltage Vg was varied from 20 to −40 V. The median value of field-effect mobility (mobility) calculated from such measurement results was 0.049 cm$^2$/Vs, and the coefficient of variation was 51.0%. As described above, in Comparative Example 2, the mobility was low and the coefficient of variation became large.

Example 6

Various kinds of organic thin film transistors having organic thin films of different compositions, respectively, were produced in the same manner as in Example 1, except for setting the channel length of the source electrode and drain electrode to be 20 μm and the channel width to be 2 mm, and for employing each of various coating liquids, in which a combination of the high molecular weight compound (8) and the low molecular weight compound (1c) was employed and the ratio of these was changed, as a coating liquid for forming an organic thin film. As coating liquids, each of those having such weight ratios of the high molecular weight compound (8) and the low molecular weight compound (1c) (high molecular weight compound (8): low molecular weight compound (1c)) as 100:0, 70:30, 50:50, 28:72 and 10:90, respectively, was employed.

For each five of organic thin film transistors obtained by using respective coating liquids, transistor characteristics were measured under such conditions that the source-drain voltage Vsd was set to be −40 V and the gate voltage Vg was varied from 20 to −40 V, and on the basis of the measurements, the median value and the coefficient of variation of the field-effect mobility (mobility) were calculated. Obtained results are shown in Table 5, with the weight ratio of the high molecular weight compound (8) and the low molecular weight compound (1c) in the coating liquids.

TABLE 5

| HIGH MOLECULAR WEIGHT COMPOUND (8) | LOW MOLECULAR WEIGHT COMPOUND (1c) | MOBILITY ($cm^2/Vs$) | COEFFICIENT OF VARIATION (%) |
| --- | --- | --- | --- |
| 100 | 0 | $3.20 \times 10^{-3}$ | 4.2 |
| 70 | 30 | $5.20 \times 10^{-3}$ | 18.5 |
| 50 | 50 | $4.20 \times 10^{-2}$ | 24 |
| 28 | 72 | $1.14 \times 10^{-1}$ | 2.2 |
| 10 | 90 | $5.76 \times 10^{-2}$ | 9.3 |

As shown in Table 5, it was known that, when the ratio of the high molecular weight compound (8) is not less than 5 parts by mass and less than 30 parts by mass in a total of 100 parts by mass of the high molecular weight compound (8) and the low molecular weight compound (1c), high field-effect mobility is obtained and, in addition, the coefficient of variation becomes extremely low.

Example 7

An organic semiconductor composition containing the high molecular weight compound (8) and the low molecular weight compound (1b) was employed to produce an organic thin film transistor having the structure shown in FIG. 1.

In the manufacturing of the organic thin film transistor, first, a glass substrate (the substrate 1) was subjected to ultrasonic cleaning with acetone for 10 min, and, after that, to ozone UV irradiation for 30 min. Next, on the substrate 1, the source electrode 5 and the drain electrode 6 (having chromium and gold stacked in this order from the substrate side) were formed by an evaporation method. At this time, the source electrode 5 and the drain electrode 6 were set to have a channel length of 20 μm and a channel width of 2 mm. After that, the substrate was immersed in a toluene-diluted phenyl ethyl trichlorosilane liquid, and thereby the substrate surface was silane-treated. Furthermore, the substrate was immersed in an isopropyl alcohol-diluted perfluorobenzene thiol liquid for 2 min, and thereby the surface of the electrode (in particular, gold) formed on the substrate was modified.

Further, the high molecular weight compound (8) and the low molecular weight compound (1b) were dissolved in xylene being a solvent so that the weight ratio of these compounds became a prescribed ratio, to produce a solution in which the concentration of the mixture of both compounds (an organic semiconductor composition) was 0.4% by weight, which was filtrated with a membrane filter to prepare a coating liquid. Incidentally, as coating liquids, those having weight ratios of the high molecular weight compound (8) and the low molecular weight compound (1b) (high molecular weight compound (8): low molecular weight compound (1b)) of 25:75, 50:50 and 75:25, respectively, were prepared.

After that, the obtained coating liquid was coated on above-mentioned surface-treated substrate by a spin coat method, and dried on a hot plate at 110° C. for 3 min, and thereby an organic thin film (the organic semiconductor layer 2) that contained the high molecular weight compound (8) and the low molecular weight compound (1b) and had a thickness of about 30 nm was formed over the substrate so as to cover the source electrode 5 and the drain electrode 6.

Over the organic thin film, an insulating film made of Teflon (registered trade mark) was formed by a spin coat method so as to give a thickness of about 300 nm, which was heat-treated at 80° C. for 10 min to form the insulating layer 3. Furthermore, on the insulating film 3, aluminum was deposited by an evaporation method to form the gate electrode 4.

For each five of organic thin film transistors obtained by using respective coating liquids, transistor characteristics were measured under such conditions that a source-drain voltage Vsd was set to be −40 V and a gate voltage Vg was varied from 20 to −40 V. On the basis of the measurements, the median value and the coefficient of variation of the field-effect mobility (mobility) were calculated. Obtained results are shown in Table 6, with the weight ratio of the high molecular weight compound (8) and the low molecular weight compound (1b) in the coating liquids.

TABLE 6

| HIGH MOLECULAR WEIGHT COMPOUND (8) | LOW MOLECULAR WEIGHT COMPOUND (1b) | MOBILITY ($cm^2/Vs$) | COEFFICIENT OF VARIATION (%) |
| --- | --- | --- | --- |
| 25 | 75 | $4.6 \times 10^{-1}$ | 23.3 |
| 50 | 50 | 1.0 | 40.7 |
| 75 | 25 | $7.4 \times 10^{-1}$ | 13.3 |

As shown in Table 6, such a result was obtained that, in the case where the ratio of the high molecular weight compound (8) is 25 parts by weight or 75 parts by weight relative to a total of 100 parts by mass of the high molecular weight compound (8) and the low molecular weight compound (1b), the field-effect mobility is high and the coefficient of variation is small, as compared with the case where the ratio is 50 parts by weight.

Example 8

An organic semiconductor composition containing the high molecular weight compound (8) and the low molecular weight compound (1b) was used for producing the organic thin film transistor having the structure shown in FIG. 1, in the same manner as in Example 7.

As the weight ratio of the high molecular weight compound (8) and the low molecular weight compound (1b) (high molecular weight compound (8): low molecular weight compound (1b)), in addition to the ratio in Example 7, those that gave 0:100, 5:95, 20:80, 27:73, 29:71, 30:70, 70:30, 71:29, 80:20 and 100:0, respectively, were prepared.

For each five of organic thin film transistors obtained by employing respective coating liquids, transistor characteristics were measured under such conditions that the source-drain voltage Vsd was set to be −40 V and the gate voltage Vg was varied from 20 to −40 V, and, on the basis of the measurement, the median value and the coefficient of variation of the field-effect mobility (mobility) was calculated. Obtained results are shown in Table 7, with the weight ratio of the high molecular weight compound (8) and the low molecular weight compound (1b) in the coating liquids.

TABLE 7

| HIGH MOLECULAR WEIGHT COMPOUND (8) | LOW MOLECULAR WEIGHT COMPOUND (1b) | MOBILITY (cm²/Vs) | COEFFICIENT OF VARIATION (%) |
|---|---|---|---|
| 0 | 100 | $1.4 \times 10^{-1}$ | 40.9 |
| 5 | 95 | $3.1 \times 10^{-1}$ | 11.3 |
| 20 | 80 | $2.8 \times 10^{-1}$ | 15.2 |
| 25 | 75 | $4.6 \times 10^{-1}$ | 23.3 |
| 27 | 73 | $4.8 \times 10^{-1}$ | 11.5 |
| 29 | 71 | $2.9 \times 10^{-1}$ | 18.8 |
| 30 | 70 | $4.0 \times 10^{-1}$ | 34.2 |
| 50 | 50 | 1.0 | 40.7 |
| 70 | 30 | $2.8 \times 10^{-1}$ | 40.1 |
| 71 | 29 | $3.5 \times 10^{-1}$ | 15.8 |
| 75 | 25 | $7.4 \times 10^{-1}$ | 13.3 |
| 80 | 20 | $3.0 \times 10^{-1}$ | 19.6 |
| 100 | 0 | $1.9 \times 10^{-2}$ | 11.0 |

Example 9

As the high molecular weight compound having a carrier transport property, a compound represented by Formula (11) (a high molecular weight compound (11)), and, as the low molecular weight compound, the compound represented by above-mentioned Formula (1b) (the low molecular weight compound (1b)) were prepared, respectively.

The high molecular weight compound (11) was synthesized as follows. First, 3.8 g (4.9 mmol) of 2,6-dibromo-4,4-dihexadecylcyclopenta[2,1-b,3,4-b']dithiophene and 1.9 g (4.9 mmol) of 4,7-bis(4,4,5,5-tetramethyl-1,3,2-dioxaborolane-2-yl)benzo-2,1,3-thiadiazole, which are monomers, were mixed at a 50:50 ratio, to which 170 mL of tetrahydrofuran, 89 mg of tris(dibenzylideneacetone)dipalladium and 0.11 g of tri-tert-butylphosphonium tetrafluoroborate were added and stirred. To the solution, 24 mL of a 2 mol/L aqueous potassium carbonate solution was dropped, which was refluxed for 3 hours. To the reaction liquid, 0.11 g of phenylboronic acid was added, which was refluxed for 1 hour. Next, to the reaction liquid, 0.1 g of N,N-diethyldithiocarbamic acid sodium salt trihydrate was added, which was refluxed for 3 hours. After that, the reaction liquid was poured into water, to which toluene was added, and the toluene layer was extracted. After washing the toluene solution with an aqueous acetic acid solution and water, the toluene solution was dropped into acetone to give a precipitate. The precipitate was dissolved in chloroform, and was purified with a silica gel column employing chloroform as a developing solvent. The chloroform solution after purification was dropped into methanol, and a precipitate was filtered to give the high molecular weight compound (11). The high molecular weight compound (11) had weight average molecular weight of 46,000 in terms of polystyrene, and number average molecular weight of 22,000.

[Compound 12]

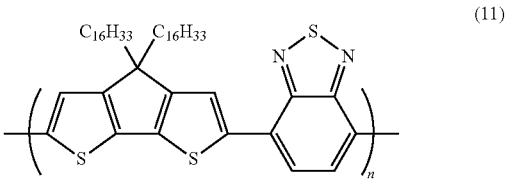

(11)

Next, in the same manner as in Example 7, while employing an organic semiconductor composition containing the high molecular weight compound (11) and the low molecular weight compound (1b), the organic thin film transistor having the structure shown in FIG. 1 was produced.

As the weight ratio of the high molecular weight compound (11) and the low molecular weight compound (1b) (high molecular weight compound (11): low molecular weight compound (1b)), each of those that gave 0:100, 25:75, 30:70, 50:50, 70:30, 75:25 and 100:0 was prepared.

For each five of organic thin film transistors obtained by using respective coating liquid, transistor characteristics were measured under such conditions that a source-drain voltage Vsd was set to be −40 V and a gate voltage Vg was varied from 20 to −40 V, and, on the basis of the measurements, the median value and the coefficient of variation of the field-effect mobility (mobility) were calculated. Obtained results are shown in Table 8, with the weight ratio of the high molecular weight compound (11) and the low molecular weight compound (1b) in the coating liquids.

TABLE 8

| HIGH MOLECULAR WEIGHT COMPOUND (11) | LOW MOLECULAR WEIGHT COMPOUND (1b) | MOBILITY (cm²/Vs) | COEFFICIENT OF VARIATION (%) |
|---|---|---|---|
| 0 | 100 | $1.5 \times 10^{-2}$ | 127.4 |
| 25 | 75 | 2.47 | 7.8 |
| 30 | 70 | 3.55 | 18.9 |
| 50 | 50 | 3.18 | 31.6 |
| 70 | 30 | $7.8 \times 10^{-1}$ | 50.2 |
| 75 | 25 | $1.8 \times 10^{-1}$ | 12.6 |
| 100 | 0 | $4.2 \times 10^{-2}$ | 11.7 |

REFERENCE SIGNS LIST

1 . . . substrate, 2 . . . organic semiconductor layer, 2a . . . organic semiconductor layer, 3 . . . insulating layer, 4 . . . gate electrode, 5 . . . source electrode, 6 . . . drain electrode, 7a . . . first electrode, 7b . . . second electrode, 8 . . . charge generating layer, 11 . . . protective film, 12 . . . interlayer insulating film, 13 . . . lower electrode (anode), 14 . . . light emitting element, 15 . . . upper electrode (cathode), 16 . . . bank part, 17 . . . sealing member, 18 . . . substrate, 100 . . . organic thin film transistor according to first embodiment, 110 . . . organic thin film transistor according to second embodiment, 120 . . . organic thin film transistor according to third embodiment, 130 . . . organic thin film transistor according to fourth embodiment, 140 . . . organic thin film transistor according to fifth embodiment, 150 . . . organic thin film transistor according to sixth embodiment, 160 . . . organic thin film transistor according to seventh embodiment, 200 . . . solar cell according to embodiment, 300 . . . photosensor according to first embodiment, 310 . . . photosensor according to second embodiment, 320 . . . photosensor according to third embodiment, 400 . . . organic electroluminescence device according to embodiment

The invention claimed is:

1. An organic semiconductor composition comprising a high molecular weight compound having a carrier transport property and a low molecular weight compound,
  wherein the low molecular weight compound has a structure represented by Formula (1);
  the high molecular weight compound is a compound having a repeating unit containing an arylamine structure and a repeating unit containing a fluorene structure, or a compound having a repeating unit containing a structure represented by Formula (3c); and
  a content ratio of the high molecular weight compound is either from not less than 5 parts by mass to less than 30 parts by mass or from more than 70 parts by mass to not more than 95 parts by mass relative to a total of 100 parts by mass of the high molecular weight compound and the low molecular weight compound,

[Compound 1]

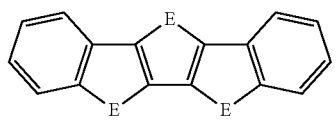
(1)

wherein E represents a sulfur atom or a selenium atom, three E's may be the same or may be different from one another, and an aromatic ring in Formula (1) may have a substituent,

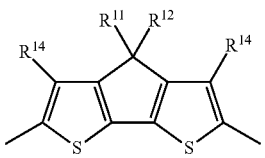
(3c)

wherein each of $R^{11}$, $R^{12}$ and $R^{14}$ is independently a hydrogen atom, a halogen atom or a monovalent group.

2. The organic semiconductor composition according to claim 1, wherein the high molecular weight compound has the repeating unit containing an arylamine structure and the repeating unit containing a fluorene structure.

3. The organic semiconductor composition according to claim 1, wherein the high molecular weight compound has the repeating unit containing a structure represented by Formula (3c).

4. The organic semiconductor composition according to claim 1, wherein the content ratio of the high molecular weight compound is from not less than 5 parts by mass to less than 30 parts by mass relative to a total of 100 parts by mass of the high molecular weight compound and the low molecular weight compound.

5. An organic thin film, comprising the organic semiconductor composition according to claim 1.

6. An organic thin film transistor comprising:
  a source electrode and a drain electrode;
  an organic semiconductor layer that serves as a current path between these electrodes; and
  a gate electrode that controls an amount of current flowing through the current path,
  wherein the organic semiconductor layer includes the organic thin film according to claim 5.

\* \* \* \* \*